(12) United States Patent
Narahara

(10) Patent No.: US 11,501,996 B2
(45) Date of Patent: Nov. 15, 2022

(54) SUSCEPTOR, EPITAXIAL GROWTH APPARATUS, METHOD OF PRODUCING EPITAXIAL SILICON WAFER, AND EPITAXIAL SILICON WAFER

(71) Applicant: SUMCO Corporation, Tokyo (JP)

(72) Inventor: Kazuhiro Narahara, Minato-ku (JP)

(73) Assignee: SUMCO CORPORATION, Tokyo (JP)

( * ) Notice: Subject to any disclaimer, the term of this patent is extended or adjusted under 35 U.S.C. 154(b) by 312 days.

(21) Appl. No.: 16/641,996

(22) PCT Filed: Aug. 31, 2017

(86) PCT No.: PCT/JP2017/031343
§ 371 (c)(1),
(2) Date: Feb. 25, 2020

(87) PCT Pub. No.: WO2019/043865
PCT Pub. Date: Mar. 7, 2019

(65) Prior Publication Data
US 2020/0185263 A1    Jun. 11, 2020

(51) Int. Cl.
*H01L 21/68* (2006.01)
*H01L 21/687* (2006.01)
(Continued)

(52) U.S. Cl.
CPC .... *H01L 21/68785* (2013.01); *C23C 16/4583* (2013.01); *C30B 25/12* (2013.01);
(Continued)

(58) Field of Classification Search
CPC ......... H01L 21/68785; H01L 21/02634; H01L 29/16; H01L 21/02381; H01L 21/02532;
(Continued)

(56) References Cited

U.S. PATENT DOCUMENTS 8,404,044 B2 *   3/2013   Arai ................... C23C 16/4584
                                                                117/109
8,940,094 B2 *   1/2015   Pitney ............... H01L 21/68735
                                                                117/86
(Continued)

FOREIGN PATENT DOCUMENTS

JP         2007294942 A      11/2007
JP         2010040534 A       2/2010
(Continued)

OTHER PUBLICATIONS

Office Action with English translation dated Jan. 20, 2020, issued by the Taiwan Patent Office in the corresponding Taiwan patent application, 11 pages.
(Continued)

*Primary Examiner* — Mohammed Shamsuzzaman
(74) *Attorney, Agent, or Firm* — Christensen O'Connor Johnson Kindness PLLC

(57) ABSTRACT

Provided is a susceptor which makes it possible to increase the circumferential flatness uniformity of an epitaxial layer of an epitaxial silicon wafer.
A susceptor 100 is provided with a concave counterbore portion on which a silicon wafer W is placed, and the radial distance L between the center of the susceptor and an opening edge of the counterbore portion varies at 90° periods in the circumferential direction. Meanwhile, when the angle at which the radial distance L is minimum is 0°, the radial distance L is a minimum value $L_1$ at 90°, 180°, and 270°; and the radial distance L is a maximum value $L_2$ at 45°, 135°, 225°, and 315°. Accordingly, the pocket width $L_p$ also varies in conformance with the variations of the radial distance L. The opening edge 110C describes four elliptical arcs being convex radially outward when the susceptor 100 is viewed from above.

1 Claim, 17 Drawing Sheets

(51) Int. Cl.
*C23C 16/458* (2006.01)
*C30B 25/12* (2006.01)
*C30B 29/36* (2006.01)
*H01L 21/02* (2006.01)
*H01L 29/16* (2006.01)

(52) U.S. Cl.
CPC ........ *C30B 29/36* (2013.01); *H01L 21/02634* (2013.01); *H01L 29/16* (2013.01)

(58) Field of Classification Search
CPC ........... H01L 21/02579; H01L 21/0262; H01L 21/67115; H01L 21/68792; H01L 21/02433; H01L 21/68735; H01L 21/02609; C23C 16/4583; C23C 16/24; C30B 25/12; C30B 29/36; C30B 29/06
See application file for complete search history.

(56) References Cited

U.S. PATENT DOCUMENTS

| | | | |
|---|---|---|---|
| 9,401,271 B2* | 7/2016 | Pitney | C23C 16/4584 |
| 9,478,697 B2* | 10/2016 | Thirunavukarasu | H01L 33/0093 |
| 9,517,539 B2* | 12/2016 | Lin | H01L 21/68735 |
| 9,797,066 B2* | 10/2017 | Ohnishi | C23C 16/46 |
| 10,145,013 B2* | 12/2018 | Krishnan | C23C 16/4584 |
| 10,865,499 B2* | 12/2020 | Haberecht | H01L 21/68735 |
| 10,991,614 B2* | 4/2021 | Schauer | H01L 21/68735 |
| 11,248,295 B2* | 2/2022 | Krishnan | C30B 25/12 |
| 2007/0227441 A1 | 10/2007 | Narahara et al. | |
| 2009/0031954 A1* | 2/2009 | Nishikido | C30B 25/12 118/728 |
| 2015/0211148 A1* | 7/2015 | Krishnan | C30B 25/12 118/728 |

FOREIGN PATENT DOCUMENTS

| | | |
|---|---|---|
| JP | 2015535142 A | 12/2015 |
| JP | 2016122779 A | 7/2016 |
| JP | 2017510088 A | 4/2017 |
| WO | 2007091638 A1 | 8/2007 |
| WO | 2014062000 A1 | 4/2014 |

OTHER PUBLICATIONS

Notification of Reason for Refusal dated Aug. 23, 2021, issued in corresponding Korean Patent Application No. 10-2020-7002974, filed Jan. 30, 2020, 11 pages.

Office Action dated Jul. 22, 2021, issued in corresponding German Patent Application No. 11 2017 007 978.0, filed Aug. 31, 2017, 17 pages.

Notice of Reasons for Refusal received for corresponding Japanese Patent Application No. 2019-538845, dated Sep. 1, 2020, 6 pages.

International Preliminary Report on Patentability received for PCT/JP2017/031343, dated Mar. 3, 2020, 13 pages.

* cited by examiner

US 11,501,996 B2

SUSCEPTOR, EPITAXIAL GROWTH APPARATUS, METHOD OF PRODUCING EPITAXIAL SILICON WAFER, AND EPITAXIAL SILICON WAFER

TECHNICAL FIELD

This disclosure relates to a susceptor and an epitaxial growth apparatus including the susceptor. Further, this disclosure relates to a method of producing an epitaxial silicon wafer using the susceptor, and an epitaxial silicon wafer.

BACKGROUND

A silicon wafer is typically obtained by growing a single crystal silicon by the Czochralski (CZ) process, etc., cutting the single crystal silicon into blocks, then slicing a resultant block thin, and subjecting a resultant slice to a surface grinding (lapping) step, an etching step, and a mirror polishing (polishing) step, followed by final cleaning. Such a silicon wafer is subsequently shipped as a product if various quality inspections observe no abnormality.

Here, for example when crystal integrity is further required or when a multi-layer structure having layers of different resistivity is needed, an epitaxial silicon wafer is produced by growing an epitaxial layer formed of a single crystal silicon thin film on a surface of the silicon wafer by vapor deposition (epitaxial growth).

The epitaxial growth is performed by blowing a growth gas to the surface of the silicon wafer placed in a counterbore portion of the susceptor while rotating the susceptor. FIG. 1 presents schematic views of a plan view of a conventionally known susceptor 1 and a cross-sectional view thereof taken along line A-A.

The susceptor 1 is provided with a circular concave counterbore portion 11, and a silicon wafer W is placed so that the center of the silicon wafer W is at the center of the counterbore portion 11. The silicon wafer W is in contact with the ledge portion 110L of a susceptor 100. In FIG. 1, a radial distance L between the center of the susceptor 1 and an opening edge 11C of the counterbore portion 11 is fixed in the circumferential direction. Accordingly, a distance between the radially outer end surface of the silicon wafer W and an inner circumferential wall surface 11A, which is so called a pocket width $L_p$, is also fixed in the circumferential direction. Therefore, the pocket width $L_p$ describes a circular arc when the susceptor 1 is viewed from above.

Further, the difference H between the heights of the upper end (corresponding to the opening edge 11C) and the lower end of the inner wall surface 11A on the opening edge 11C side of the counterbore portion 11 in the susceptor 1 (also referred to as "counterbore depth") is fixed in the circumferential direction, so that the difference $H_w$ between the height of the upper end of the inner wall surface 11A and the height of the surface of the silicon wafer W is also fixed.

Here, as illustrated in FIG. 2, in a silicon wafer having a main surface which is a {100} plane, a <110> direction and a <100> direction are alternately repeated every 45°. Due to this periodicity of the crystal orientation, when an epitaxial layer is grown on a surface of the silicon wafer, an epitaxial layer is grown at varied growth rates at 90° periods (referred to as "growth rate orientation dependence"). The thickness of the epitaxial layer greatly varies in the circumferential direction due to such difference of growth rates depending on the crystal orientation, and the effect is larger in a wafer edge area or a wafer outer circumferential area. Accordingly, the growth rate orientation dependence is known as a cause of lower flatness of epitaxial silicon wafers.

JP 2007-294942 A (PTL 1) discloses a susceptor of which structure and/or shape varies periodically according to the variation of crystal orientation of the semiconductor wafer in the vicinity of the inner circumferential surface of the susceptor opening. Further, PTL 1 describes that the structure and/or the shape preferably vary periodically in accordance with the variation of the partial heat capacity of the susceptor, the counterbore depth of the pocket, or the pocket width at a period of 90°, 180°, or 270°.

As described in PTL 1, a wider gap distance of the susceptor allows a silicon source gas to be smoothly supplied to the periphery of the silicon wafer, which increases the growth rate of the epitaxial layer at the periphery. By contrast, a smaller gap distance of the susceptor causes the opposite phenomenon resulting in a lower growth rate. Further, a shallower counterbore depth of the susceptor allows a silicon source gas to be smoothly supplied to the periphery of the wafer, which increases the growth rate of the epitaxial layer at the periphery. By contrast, a deeper counterbore depth of the susceptor causes the opposite phenomenon resulting in a lower growth rate.

Accordingly, the use of the susceptor according to PTL 1 can reduce the growth rate orientation dependence, which improves the thickness profile of the epitaxial layer.

CITATION LIST

Patent Literature

PTL 1: JP 2007-294942 A

SUMMARY

Technical Problem

As a susceptor according to the technique of PTL 1, a susceptor 2 as illustrated in FIG. 3 is given as an example, in which an opening edge 21C of a counterbore portion 21 describes four circular arcs when the susceptor 2 is viewed from above. The susceptor 2 illustrated in FIG. 3 allows the pocket width $L_p$ to be periodically vary according to the change of the crystal orientation of the silicon wafer. With the use of such a susceptor 2, the growth rate orientation dependence during the epitaxial growth can be reduced, thus the uniformity of the flatness in the circumferential direction (hereinafter also referred to as "circumferential flatness uniformity") of the epitaxial silicon wafer can be significantly improved (in particular, variation of the thickness profile in the circumferential direction can be significantly reduced) as compared with the case of using the susceptor 1 depicted in FIG. 1. However, the uniformity of the flatness in the circumferential direction is likely worse in a wafer edge portion, and further improvement is expected.

It could therefore be helpful to provide a susceptor which makes it possible to increase the circumferential flatness uniformity of an epitaxial layer of an epitaxial silicon wafer. It could also be helpful to provide an epitaxial growth apparatus including the susceptor. Further, it could be helpful to provide a method of producing an epitaxial silicon wafer using the susceptor and an epitaxial silicon wafer having improved circumferential flatness uniformity, which can be obtained by the method.

Solution to Problem

We diligently studied to solve the above problems. We formed an epitaxial layer using the susceptor 2 of which opening edge 21C of the counter bore portion 21 describes four circular arcs (curvature radius R), depicted in FIG. 3. The pocket width $L_P$, which is the distance between the opening edge 21C of the counterbore portion 21 in the susceptor 2 and the silicon wafer W varies at 90° periods in the circumferential direction. When the angle at which the pocket width $L_p$ is minimum is 0°, the Pocket width $L_P$ is minimum at 90°, 180°, and 270°; and the pocket width $L_p$ is maximum at 45°, 135°, 225°, and 315°.

In the obtained epitaxial silicon wafer, the flatness of the epitaxial wafer was found to vary periodically at 45° periods in the circumferential direction. Such a result is presumably due to insufficient control of the growth rate orientation dependence because the amount of variations of the pocket width in the circumferential direction cannot conform to the growth rate orientation dependence when the opening edge 21C describes circular arcs. Accordingly, in order to optimize the amount of the variation of the pocket width $L_P$, epitaxial growth was performed using a susceptor designed such that the opening edge describes elliptical arcs, the growth rate orientation dependence was significantly reduced even as compared with the case of using the susceptor 2. We found that the same idea applies to the amount of variations of the counterbore depth, and the effect was experimentally confirmed. This disclosure completed based on the above findings primarily includes the following features.

<1> A susceptor for placing a silicon wafer thereon within an epitaxial growth apparatus,
the susceptor being provided with a concave counterbore portion in which the silicon wafer is placed,
wherein a radial distance between the center of the susceptor and an opening edge of the counterbore portion varies at 90° periods in the circumferential direction, and when an angle at which the radial distance is minimum is 0°, the radial distance is minimum at 90°, 180°, and 270°, and the radial distance is maximum at 45°, 135°, 225°, and 315°, and
the opening edge describes four elliptical arcs being convex radially outward when the susceptor is viewed from above.

<2> A susceptor for placing a silicon wafer thereon within an epitaxial growth apparatus,
the susceptor being provided with a concave counterbore portion in which the silicon wafer is placed,
wherein a difference between heights of an upper end and a lower end of an inner wall surface on the opening edge side of the counterbore portion varies at 90° periods in the circumferential direction, and when an angle at which the height difference is maximum is 0°, the height difference is maximum at 90°, 180°, and 270°, and the height difference is minimum at 45°, 135°, 225°, and 315°, and
in a projection view of a radial exterior of the susceptor, the opening edge of the counterbore portion describes four elliptical arcs being convex on the bottom side of the counterbore portion.

<3> The susceptor according to <1> or <2> above,
wherein the silicon wafer is placed so that a <110> direction of the silicon wafer conforms to the direction of 0° of the susceptor, and in an epitaxial silicon wafer in which an epitaxial layer is formed on a surface of the silicon wafer, the elliptical arcs are provided such that a circumferential thickness profile variation index $\Delta t_0$ of the epitaxial layer at a position of 1 mm from an edge of the epitaxial silicon wafer in a circumferential direction according to Equation 1 below is 0.75% or less, $$\Delta t_0 = \frac{t_{Max} - t_{min}}{t_{Ave}}, \quad [1]$$

where $t_{Max}$ is a maximum thickness of the epitaxial layer at the position of 1 mm from the edge in the circumferential direction, $t_{Min}$ is a minimum thickness of the epitaxial layer at the position of 1 mm from the edge in the circumferential direction, and $t_{Ave}$ is an average thickness of the epitaxial layer at the position of 1 mm from the edge in the circumferential direction.

<4> A susceptor for placing a silicon wafer thereon within an epitaxial growth apparatus,
the susceptor being provided with a concave counterbore portion in which the silicon wafer is placed,
wherein a radial distance between the center of the susceptor and an opening edge of the counterbore portion varies at 90° periods in the circumferential direction, and when an angle at which the radial distance is minimum is 0°, the radial distance is minimum at 90°, 180°, and 270°, and the radial distance is maximum at 45°, 135°, 225°, and 315°.
the opening edge describes four first elliptical arcs being convex radially outward when the susceptor is viewed from above,
a difference between heights of an upper end and a lower end of an inner wall surface on the opening edge side of the counterbore portion varies at 90° periods in the circumferential direction, and when an angle at which the height difference is maximum is 0°, the height difference is maximum at 90°, 180°, and 270°, and the height difference is minimum at 45°, 135°, 225°, and 315°, and
in a projection view of a radial exterior of the susceptor, the opening edge of the counterbore portion describes four second elliptical arcs being convex on the bottom side of the counterbore portion.

<5> The susceptor according to <4> above,
wherein the silicon wafer is placed so that a <110> direction of the silicon wafer conforms to the direction of 0° of the susceptor, and in an epitaxial silicon wafer in which epitaxial layer is formed on a surface of the silicon wafer, the first elliptical arcs and the second elliptical arcs are provided such that a circumferential thickness profile variation index $\Delta t_0$ of the epitaxial layer at a position of 1 mm from an edge of the epitaxial silicon wafer in a circumferential direction according to Equation 1 below is 0.75% or less, $$\Delta t_0 = \frac{t_{Max} - t_{min}}{t_{Ave}}, \quad [1]$$

where $t_{Max}$ is a maximum thickness of the epitaxial layer at the position of 1 mm from the edge in the circumferential direction, $t_{Min}$ is a minimum thickness of the epitaxial layer at the position of 1 mm from the edge in the circumferential direction, and $t_{Ave}$ is an average thickness of the epitaxial layer at the position of 1 mm from the edge in the circumferential direction.

<6> An epitaxial growth apparatus including the susceptor according to any one of <1> to <5> above.

<7> A method of producing an epitaxial silicon wafer, comprising the steps of:
placing the silicon wafer on the susceptor according to any one of Claims 1, 2, and 4 so that a <110> direction of the silicon wafer conforms to the direction of 0° of the susceptor; and forming an epitaxial layer on the surface of the silicon wafer.

<8> A silicon epitaxial wafer having a surface on which an epitaxial layer is formed,
wherein a circumferential thickness profile variation index $\Delta t_0$ of the epitaxial layer at a position of 1 mm from an edge of the epitaxial silicon wafer in a circumferential direction according to Equation 1 below is 0.75% or less, $$\Delta t_0 = \frac{t_{Max} - t_{min}}{t_{Ave}}, \quad [1]$$

where $t_{Max}$ is a maximum thickness of the epitaxial layer at the position of 1 mm from the edge in the circumferential direction, $t_{Min}$ is a minimum thickness of the epitaxial layer at the position of 1 mm from the edge in the circumferential direction, and $t_{Ave}$ is an average thickness of the epitaxial layer at the position of 1 mm from the edge in the circumferential direction.

Advantageous Effect

This disclosure can provide a susceptor which makes it possible to increase the circumferential flatness uniformity of an epitaxial layer of an epitaxial silicon wafer. This disclosure can also provide an epitaxial growth apparatus including the susceptor. Further, this disclosure can provide a method of producing an epitaxial silicon wafer using the susceptor and an epitaxial silicon wafer having improved circumferential flatness uniformity, which can be obtained by the method.

BRIEF DESCRIPTION OF THE DRAWINGS

In the accompanying drawings.

DETAILED DESCRIPTION

A susceptor according to this disclosure and an epitaxial growth apparatus including the susceptor will now be described with reference to the drawings. Further, a method of producing an epitaxial silicon wafer susceptor according to this disclosure and an epitaxial silicon wafer obtained by the method will be described. For convenience of description, features in FIGS. 4A to 4D, FIGS. 5A to 5D, FIG. 6, and FIG. 7 are vertically or horizontally exaggerated for convenience of description, and the components are not to scale.

Note that it should readily be understood that the terms "elliptical arc", "period", "angle", "symmetric", and "fixed" are not required to be strict in mathematical and geometric senses, and dimensional tolerances and geometrical tolerances are determined in consideration of variations caused in the production of a susceptor.

(Susceptor of First Embodiment)

A susceptor 100 according to a first embodiment of this disclosure is described with reference to FIG. 4A to FIG. 4D. The susceptor 100 according to the first embodiment of this disclosure is a susceptor for placing a silicon wafer W thereon within an epitaxial growth apparatus. The susceptor 100 is provided with a concave counterbore portion 110 on which the silicon wafer W is placed, and the radial distance L between the center of the susceptor 100 and an opening edge 110C of the counterbore portion 110 varies at 90° periods in the circumferential direction. When the angle at which the radial distance L is minimum is 0°, the radial distance L is minimum at 90°, 180°, and 270°; and the radial distance L is maximum at 45°, 135°, 225°, and 315°. Accordingly, the pocket width $L_p$ also varies in conformance with the variations of the radial distance L. Further, the opening edge 110C describes four elliptical arcs being convex radially outward when the susceptor 100 is viewed from above. Since the radial distance L varies at 90° periods in the circumferential direction, the four elliptical arcs have 4-fold rotational symmetry. For brevity, FIG. 4A depicts only one ellipse forming one of the elliptical arcs.

Figure 1:
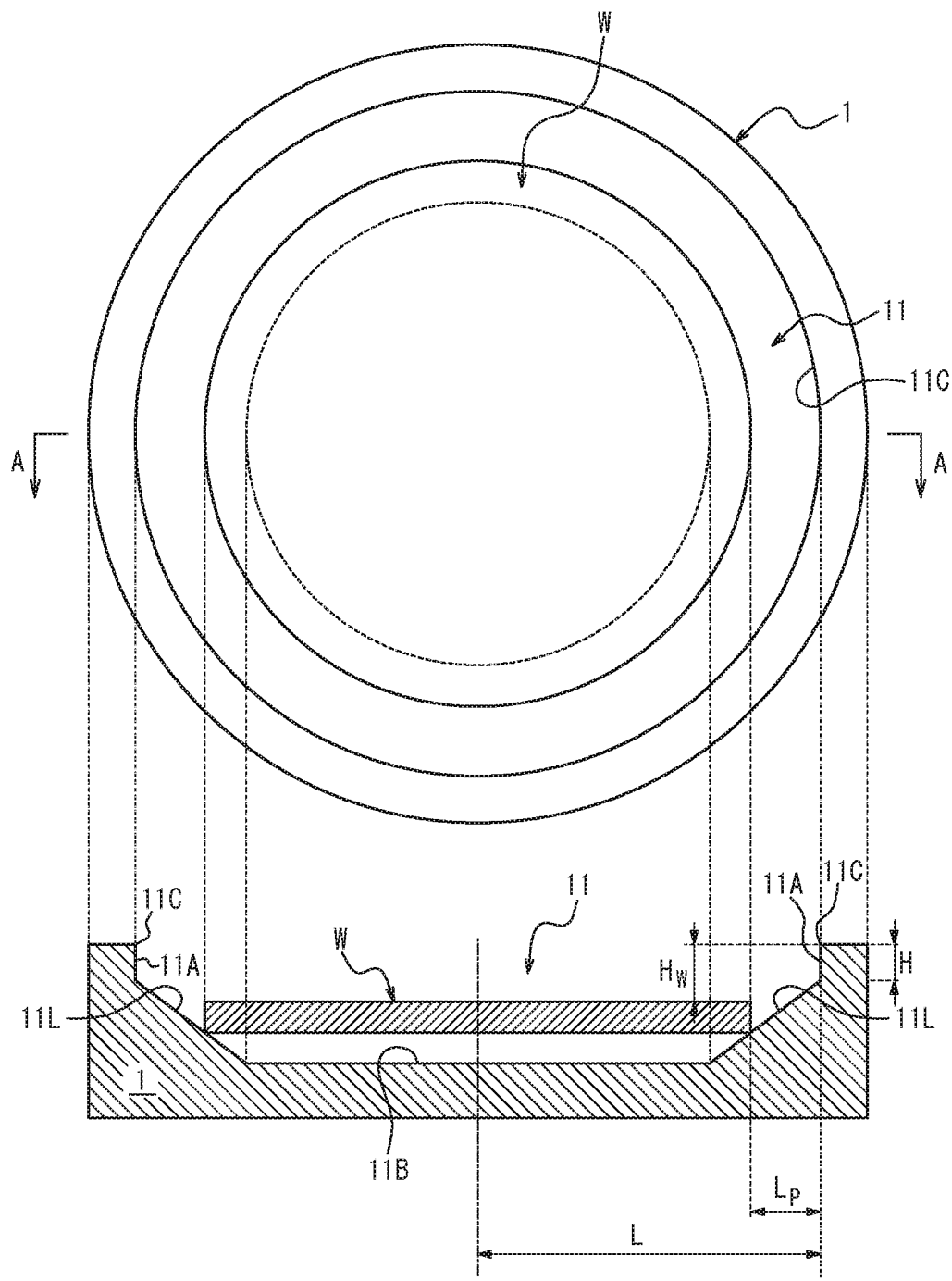
FIG. 1 presents a schematic cross-sectional view of a conventionally known epitaxial susceptor and a cross-sectional view thereof taken along line A-A.
Figure 2:
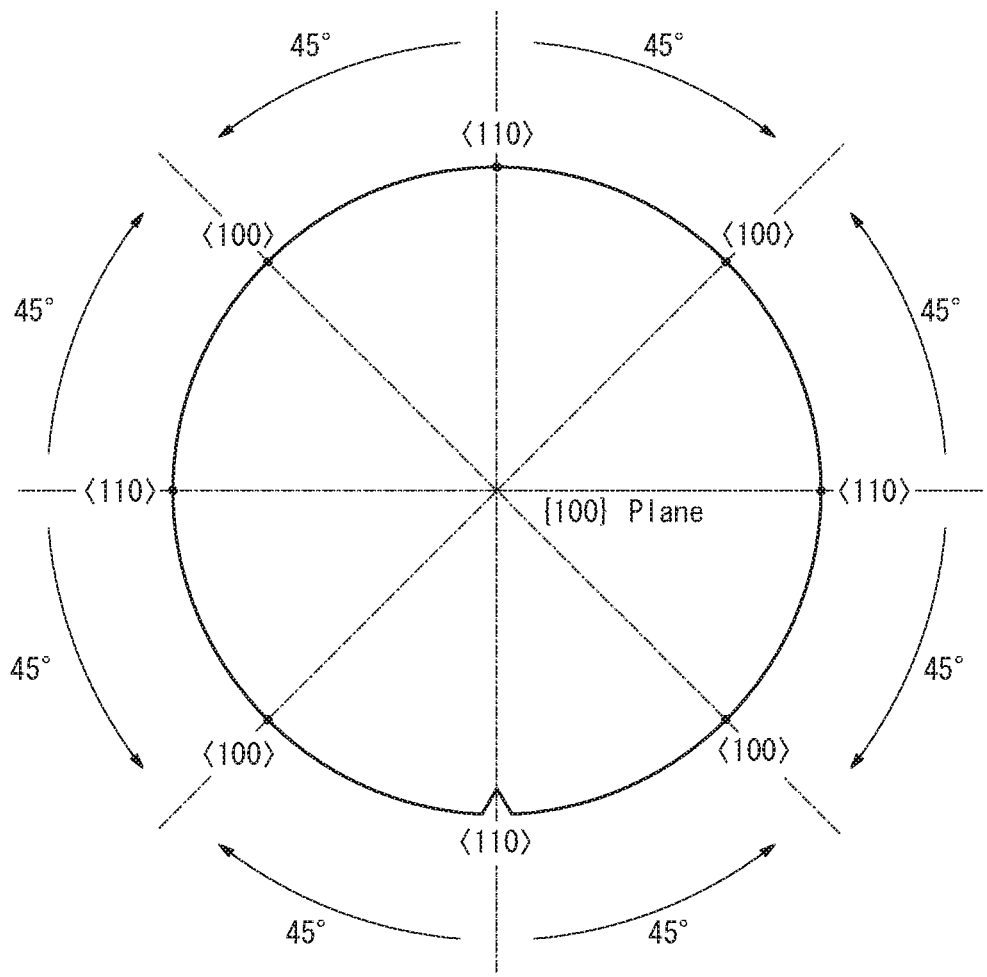
FIG. 2 is a schematic view illustrating the crystal orientation of a silicon wafer having a main surface of a {100} plane.
Figure 3:
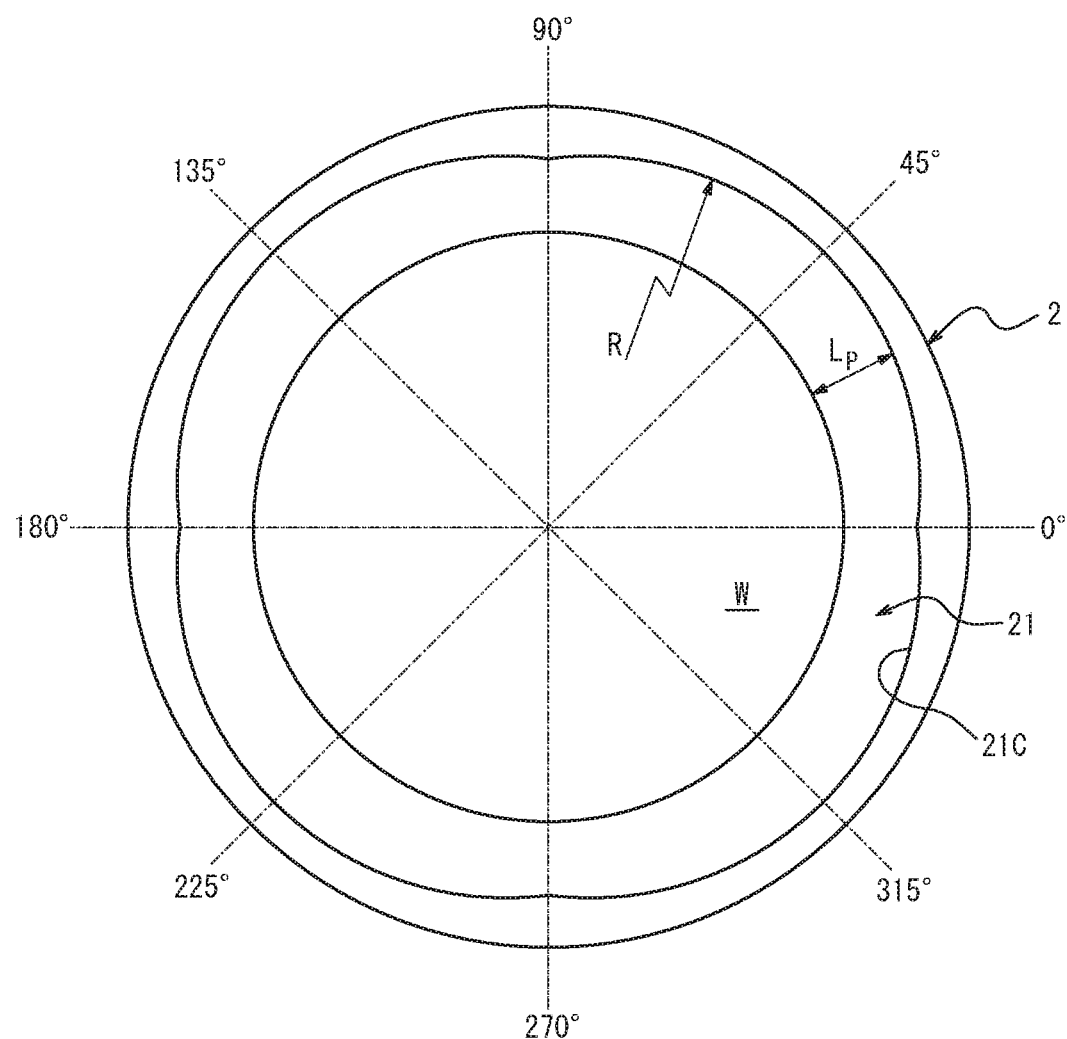
FIG. 3 is a schematic view of a susceptor in which an opening edge of a counterbore portion describes four circular arcs.
Figure 4A:
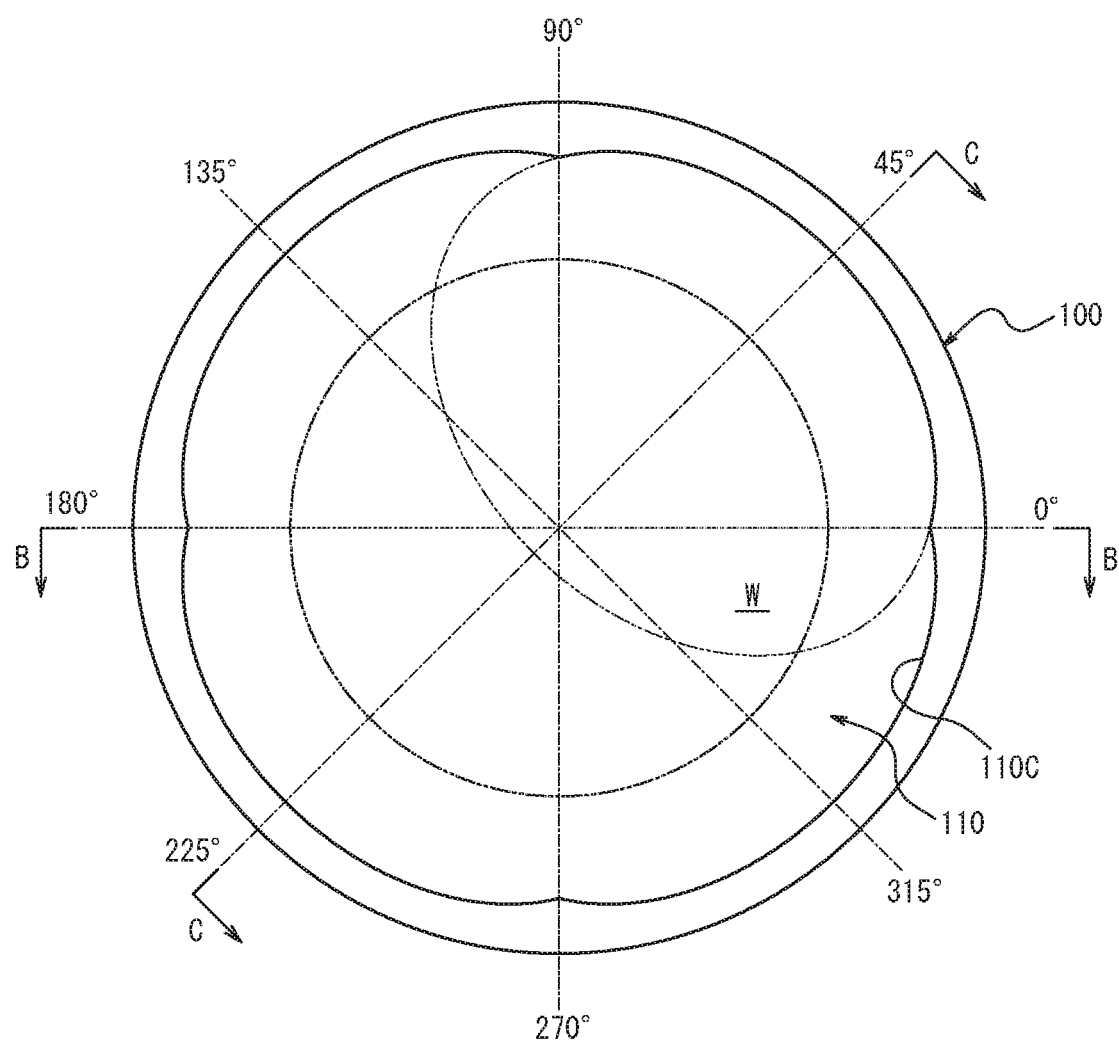
FIG. 4A is a schematic plan view of a susceptor according to a first embodiment of this disclosure.
Figure 4B:
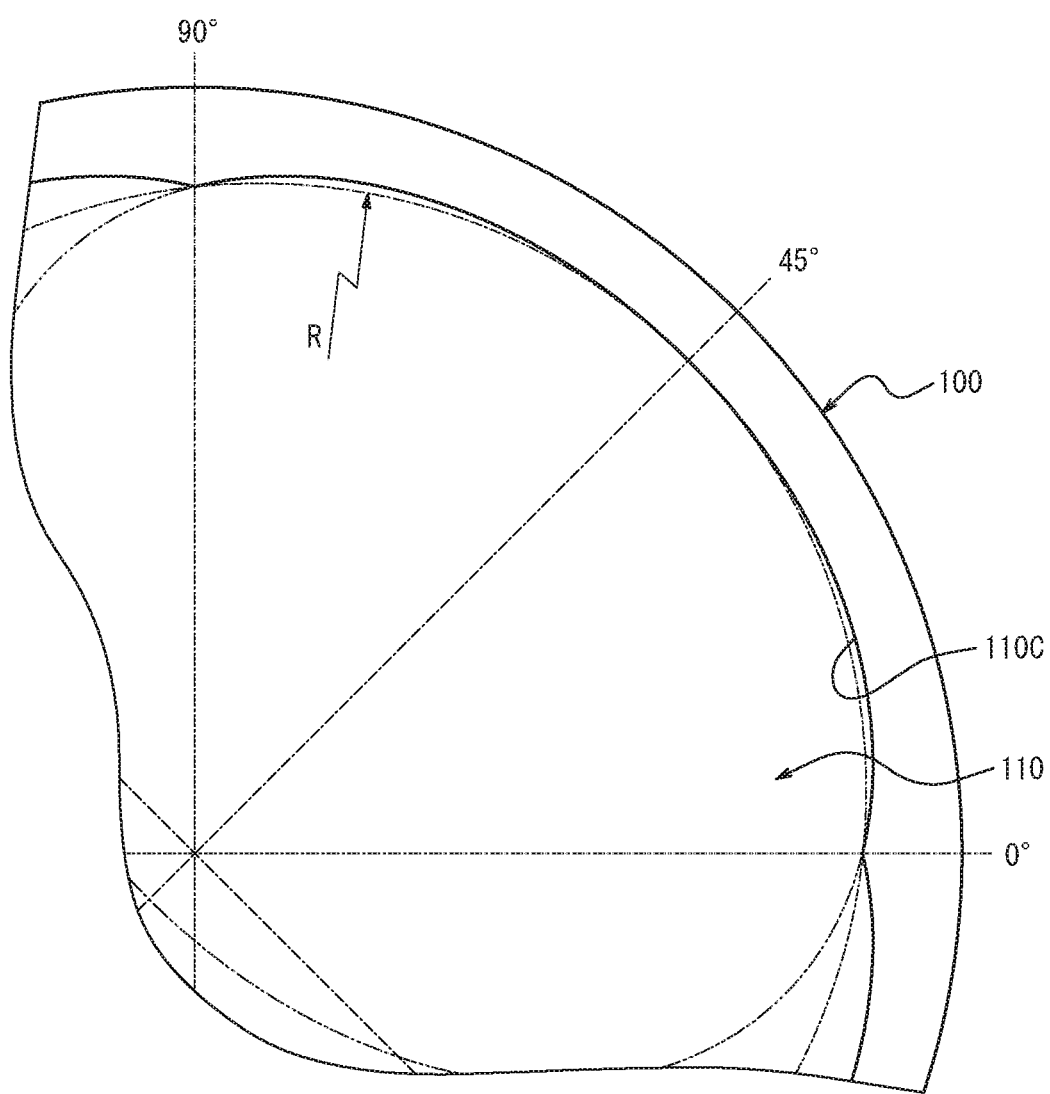
FIG. 4B is an enlarged schematic view of around a range of 0° to 90° in FIG. 4A.

FIG. 4B prevents an enlarged schematic view of around a range of 0° to 90° in FIG. 4A. The opening edge 110C describes elliptical arcs being convex radially outward, and the radial distance L is a minimum value $L_1$ at positions of 0° and 90°, and the radial distance L is a maximum value $L_2$ at a position of 45° (see also FIG. 4C, FIG. 4D). Referring to FIG. 4A and FIG. 4B, the direction of 45° and the minor axis of the elliptical arc coincide. Further, FIG. 4B depicts a circular arc (curvature radius R, depicted by a dot-dashed line) for comparison with the elliptical arc. The radial distance L of this circular arc at the positions of 0° (radial distance L is minimum), 45° (radial distance L is maximum), and 90° (radial distance L is minimum) from the susceptor center agrees with the radial distance of the elliptical arc at the same angles. As compared with this circular arc, the ellipse forming the elliptical arc (depicted by the dot-dot-dashed line) is flatter than the circle having the radius R forming the circular arc. The variation of the radial distance L from the position of 0° is greater than the variation of the case of the circular arc. Note that the circular arc is inscribed in the elliptical arc described by the opening edge 110C at the position of 45° where the radial distance L is maximum.

Figure 4C:
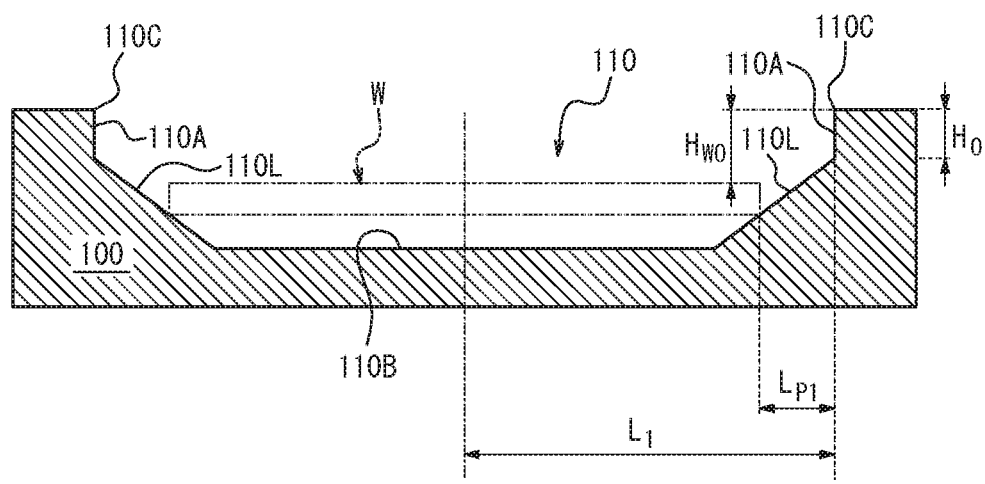
FIG. 4C is a cross-sectional view of FIG. 4A taken along line B-B.
Figure 4D:
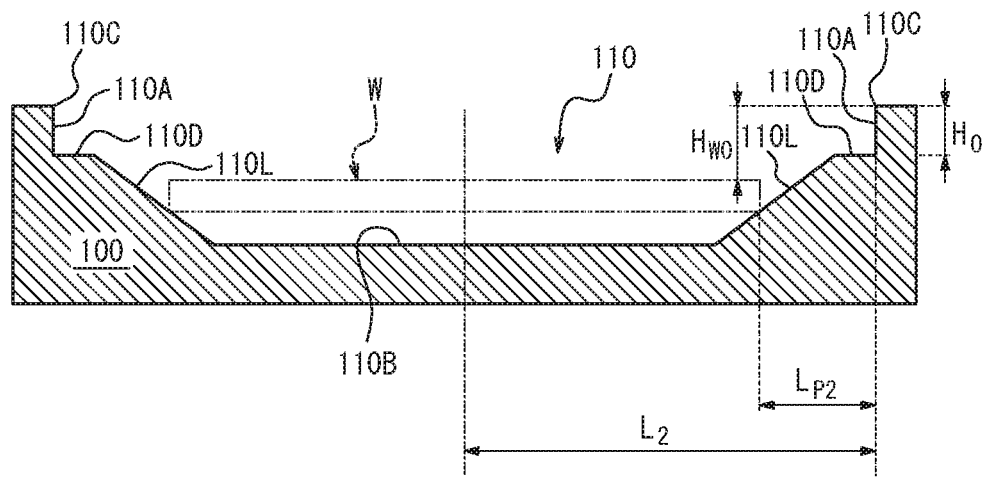
FIG. 4D is a cross-sectional view of FIG. 4A taken along line C-C.

As illustrated in FIG. 4C, a pocket width $L_{p1}$ of the susceptor 100 is minimum at the position of 0°, and as illustrated in FIG. 4D, a pocket width $L_{p2}$ of the susceptor 100 is maximum at the position of 45°. As is conventionally known, when the pocket width $L_p$ of the susceptor 100 is large, a silicon source gas can easily be supplied smoothly to the periphery of the silicon wafer W, which increases the growth rate of the epitaxial layer at the periphery. By contrast, a smaller pocket width $L_p$ of the susceptor 100 causes the opposite phenomenon resulting in a lower growth rate. Accordingly, at 0° and around 0° in the circumferential direction, the growth rate of the epitaxial layer is low, whereas the growth rate of the epitaxial layer is high at 45° and around 45° in the circumferential direction. Since the opening edge 110C describes the elliptical arcs mentioned above, the variations of the pocket width $L_p$ and the radial distance L from the susceptor center conform to the shape of the elliptical arcs.

When the silicon wafer W is placed so that the <110> directions of the silicon wafer W are at directions of 0°, 90°, 180°, and 270° of the susceptor 100, the growth rate orientation dependence can be very effectively reduced. Performing epitaxial growth while controlling the growth rate orientation dependence can increase the circumferential flatness uniformity of the epitaxial layer of the epitaxial silicon wafer. When the silicon wafer W is placed so that the <110> directions of the silicon wafer W are at directions of 0°, 90°, 180°, and 270° of the susceptor 100 as described above, the <100> directions of the silicon wafer W are at directions of 45°, 135°, 225°, and 315° of the susceptor 100.

The aforementioned elliptical arc is preferably designed so that the pocket width $L_p$ that is the radial distance between the susceptor 100 and the silicon wafer W varies within a range of 1 mm to 4 mm. This range of the pocket width $L_p$ is not limited by the diameter of the silicon wafer, and the pocket width $L_p$ may vary within a comparable range even when the diameter is 150 mm to 450 mm. Note that for example when the diameter of the silicon wafer is 300 mm (radius: 150 mm), the radial distance L corresponding to the pocket width $L_p$ is 151 mm to 154 mm.

The relationship between the longer diameter (the length of the major axis) and the shorter diameter (the length of the minor axis) of the ellipse forming each elliptical arc and the chord of the elliptical arc is not limited as long as the elliptical arcs are provided so as to satisfy the maximum and minimum conditions of the radial distance L at the angular positions described above. However, the conditions required of an ellipse forming each elliptical arc (the longer diameter and the shorter diameter, the minor axis direction, and the chord of the elliptical arc) substantially depend on the geometric positional relationship. Note that it is preferred that the silicon wafer W is placed so that a <110> direction of the silicon wafer conforms to the direction of 0° of the susceptor 100, and in the epitaxial silicon wafer in which an epitaxial layer is formed on a surface of the silicon wafer W, the elliptical arcs are provided such that the circumferential thickness profile variation index $\Delta t_0$ of the epitaxial layer at the position of 1 mm from the edge of the epitaxial silicon wafer in the circumferential direction is 0.75% or less. Here, the circumferential variation index $\Delta t_0$ is defined by Equation 1 below:

$$\Delta t_0 = \frac{t_{Max} - t_{min}}{t_{Ave}}, \qquad [1]$$

where $t_{Max}$ is the maximum thickness of the epitaxial layer at the position of 1 mm from the edge in the circumferential direction, $t_{Min}$ is the minimum thickness of the epitaxial layer at the position of 1 mm from the edge in the circumferential direction, and $t_{Ave}$ is the average thickness of the epitaxial layer at the position of 1 mm from the edge in the circumferential direction. Further, to obtain such elliptical arcs, more preferably, the major axis of the ellipse forming each elliptical arc is equal to or more than ½ the maximum opening diameter of the counterbore portion 110. More preferably, the elliptical arcs are provided such that the circumferential variation index $\Delta t_0$ is 0.70% or less, yet more preferably, the elliptical arcs are provided such that the circumferential variation index $\Delta t_0$ is 0.65% or less. Although the lower limit is not limited, the circumferential variation index $\Delta t_0$ can be set to 0.10% or more in accordance with this embodiment.

In order to vary the radial distance L in the circumferential direction (consequently, the pocket width $L_p$ inevitably varies in the circumferential direction as well) in FIG. 4C and FIG. 4D, a flat surface 110D may be provided on the opening edge 110C side of the counterbore, as illustrated in FIG. 4D. However, as long as the radial distance L is varied in the circumferential direction, for example, the inclination angle of the ledge portion 110L where the silicon wafer W is in contact with the susceptor 100 may be varied instead of providing such a flat surface 110D. In addition to this, the angle of the counterbore wall, the heat capacity of the susceptor, and the intervals in an adjusting member, for example, irregularities in the surface portion of the susceptor in the vicinity of the counterbore may be varied.

FIG. 4A to FIG. 4D illustrate that the difference H between the heights of the upper end (opening edge 110C) and the lower end of the inner wall surface 110A on the opening edge 110C side of the counterbore portion 110 of the susceptor 100 (so-called counterbore depth) is fixed at $H_0$, and accordingly the shoulder height $H_{W0}$ is also fixed. However, as described below in a third embodiment, the height difference H and the shoulder height $H_{W0}$ in the susceptor 100 of the first embodiment need not be fixed and may vary.

(Susceptor of Second Embodiment)

A susceptor 200 according to a second embodiment of this disclosure is described with reference to FIG. 5A to FIG. 5D. The susceptor 200 according to the second embodiment of this disclosure is a susceptor for placing a silicon wafer W thereon within an epitaxial growth apparatus. The susceptor 200 is provided with a concave counterbore portion 210 in which the silicon wafer W is placed, and a difference H between the heights of an upper end (corresponding to an opening edge 210C) and a lower end of an inner wall surface 210A on the opening edge 210C side of the counterbore portion 210 varies at 90° periods in the circumferential direction. Meanwhile, when an angle at which the height difference H is maximum is 0°, the height difference H is maximum at 90°, 180°, and 270°, and the height difference H is minimum at 45°, 135°, 225°, and 315°. Further, in a projection view of the radial exterior of the susceptor 200, the opening edge 210C of the counterbore portion 210 describes four elliptical arcs being convex on the bottom side of the counterbore portion 210.

Figure 5A:
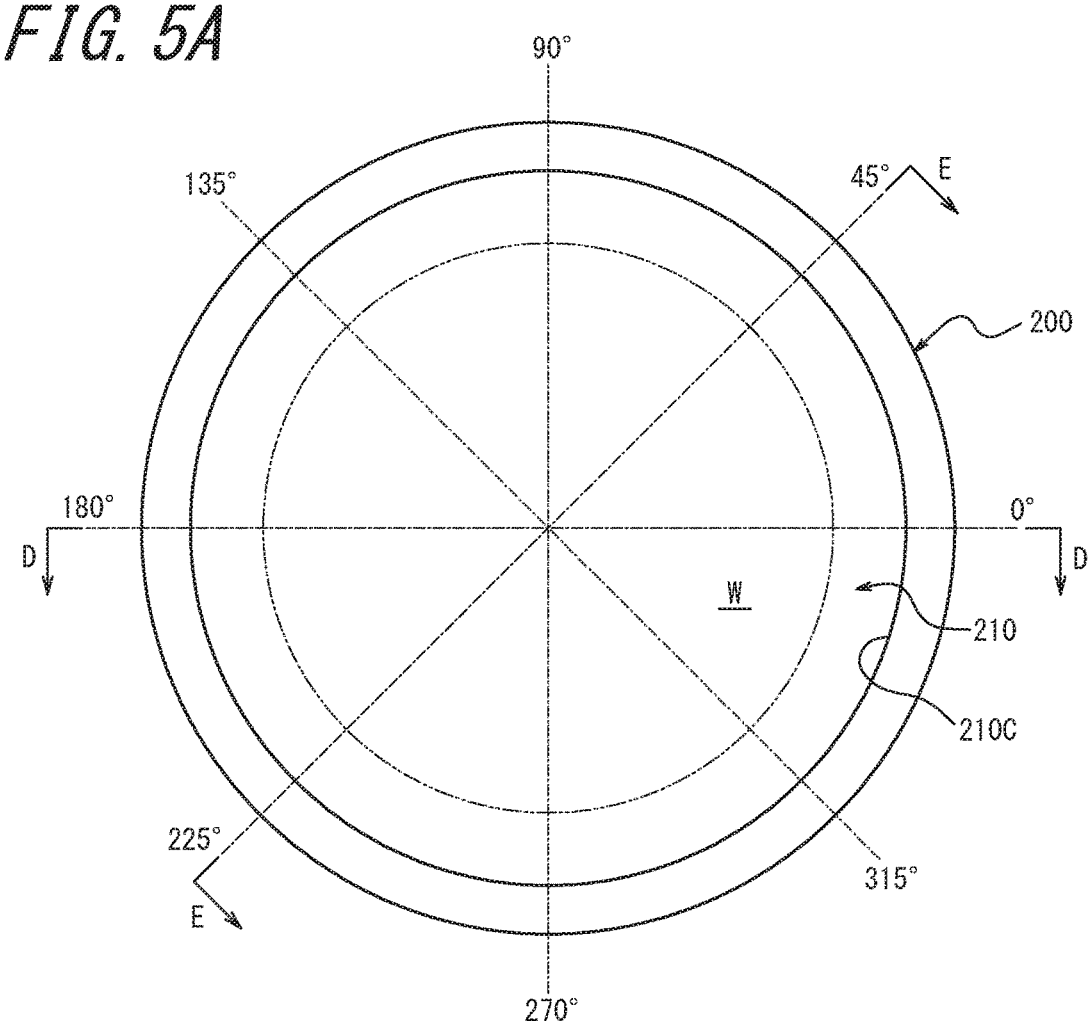
FIG. 5A is a schematic plan view of a susceptor according to a second embodiment of this disclosure.
Figure 5B:
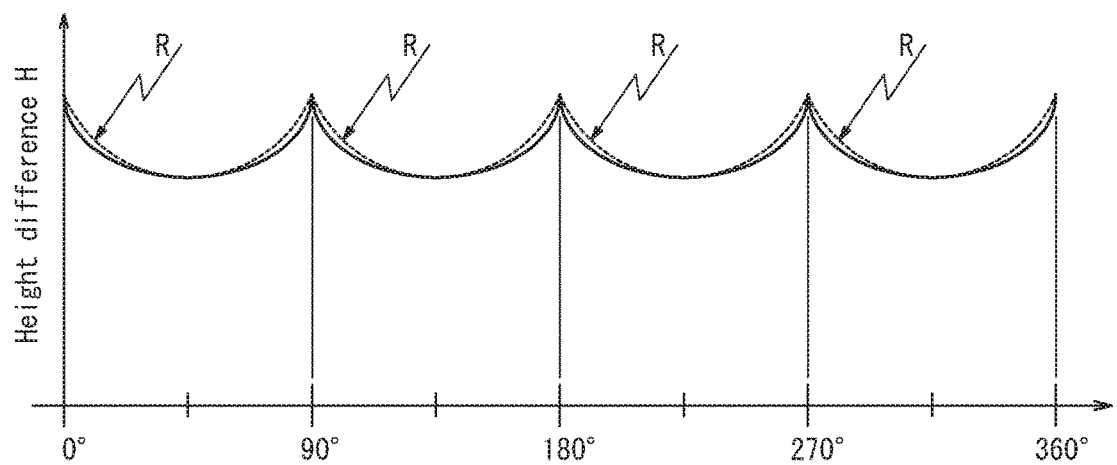
FIG. 5B is a schematic view of a trace of an opening edge of a counterbore portion in the projection view of the radial exterior in FIG. 5A.
Figure 5C:
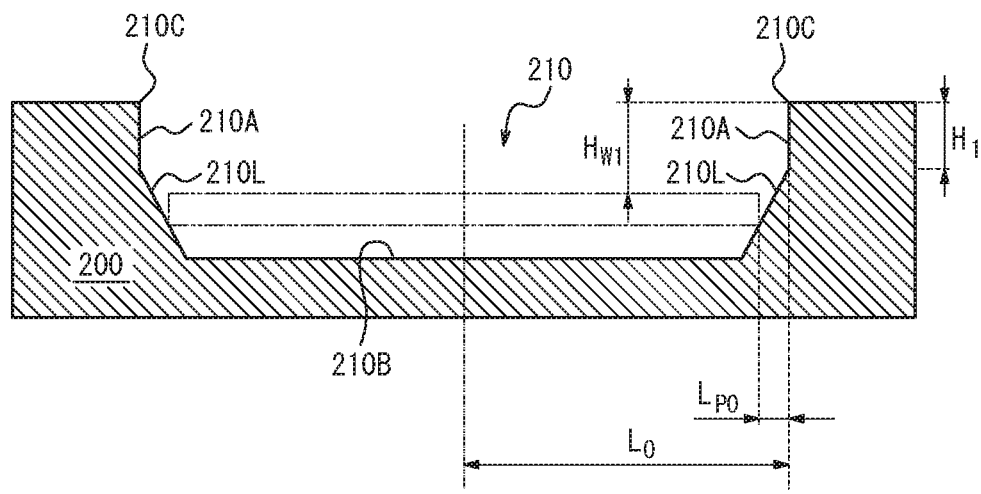
FIG. 5C is a cross-sectional view of FIG. 5A taken along line D-D.
Figure 5D:
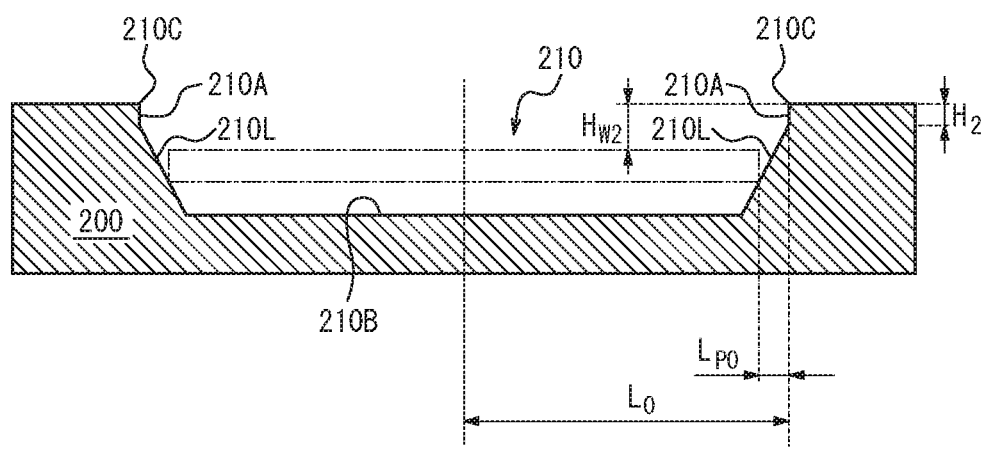
FIG. 5D is a cross-sectional view of FIG. 5A taken along line E-E.

FIG. 5B presents a projection view of the exterior of the opening edge 210 in FIG. 5A in the radial direction of the susceptor 200. The solid line in FIG. 5B represents elliptical arcs, and the broken line represents circular arcs. The elliptical arcs are flatter as compared with circular arcs as described with reference to FIG. 4B, and the variation of the height difference H from the position of 0° is larger as compared with the case of circular arcs. Note that the four elliptical arcs in the projection view of the radial exterior have 90° rotational symmetry with the elliptical arcs depicted in FIG. 4B about the susceptor center. Referring to FIG. 5C and FIG. 5D together, the height difference H is a maximum value $H_1$ at positions of 0°, 90°, 180°, and 270°, and the height difference H is a minimum value $H_2$ at positions of 45°, 135°, 225°, and 315°. Here, the minor axis direction of the ellipse forming each elliptical arc in FIG. 5B agrees with the vertical direction.

As is conventionally known, a shallower counterbore depth of the susceptor 200 allows a silicon source gas to be smoothly supplied to the periphery of the wafer, which increases the growth rate of the epitaxial layer at the periphery. In other words, when the difference $H_w$ between the heights of the surface of the silicon wafer W and the opening edge 210C of the susceptor, also called the shoulder height is small, and accordingly the above height difference H is small, the growth rate of the epitaxial layer is high at the periphery. By contrast, a deeper counterbore depth of the susceptor causes the opposite phenomenon resulting in a lower growth rate. Namely, when the shoulder height difference $H_w$ is large, and accordingly the above height difference H is large, the growth rate of the epitaxial layer is low at the periphery. Accordingly, at 0° and around 0° in the circumferential direction, the growth rate of the epitaxial layer is low, whereas the growth rate of the epitaxial layer is high at 45° and around 45° in the circumferential direction. Since the opening edge 210C describes four elliptical arcs in the projection view of the radial exterior, the height difference H also conforms to the shape of the elliptical arcs.

When the silicon wafer W is placed so that the <110> directions of the silicon wafer W are at directions of 0°, 90°, 180°, and 270° of the susceptor 100 as described above, the growth rate orientation dependence can be very effectively reduced, as in the first embodiment described above. Performing epitaxial growth while controlling the growth rate orientation dependence in such a manner can increase the circumferential flatness uniformity of the epitaxial layer of the epitaxial silicon wafer.

The relationship between the longer diameter (the length of the major axis) and the shorter diameter (the length of the minor axis) of the ellipse forming each elliptical arc and the chord of the elliptical arc is not limited in the radial projection view as long as the elliptical arcs are provided so as to satisfy the maximum and minimum conditions of the height difference H at the angular positions mentioned above. Further, the elliptical arcs meeting the conditions substantially depend on the geometric positional relationship. Note that it is preferred that the silicon wafer W is placed so that a <110> direction of the silicon wafer conforms to the direction of 0° of the susceptor 200, and in the epitaxial silicon wafer in which an epitaxial layer is formed on a surface of the silicon wafer W, the elliptical arcs are provided such that the circumferential thickness profile variation index $\Delta t_0$ of the epitaxial layer at the position of 1 mm from the edge of the epitaxial silicon wafer in the circumferential direction is 0.75% or less. Here, the circumferential variation index $\Delta t_0$ is defined by Equation 1 above. More preferably, the elliptical arcs are provided such that the circumferential variation index $\Delta t_0$ is 0.70% or less, yet more preferably, the elliptical arcs are provided such that the circumferential variation index $\Delta t_0$ is 0.65% or less. Although the lower limit is not limited, the circumferential variation index $\Delta t_0$ can be set to 0.10% or more in accordance with this embodiment.

In order to vary the height difference H in the circumferential direction (consequently, the shoulder height $H_w$ inevitably varies in the circumferential direction as well) in FIG. 5C and FIG. 5D, the thickness of the upper end at the periphery of the susceptor 200 may be varied, as illustrated in FIG. 5D. Alternatively, the height difference H may be varied in the circumferential direction by other methods. Note that the variation range of the height difference H (equal to the variation range of the shoulder height $H_w$) is preferably around 0.20 mm to 0.40 mm.

FIG. 5A to FIG. 5D illustrate that the radial distance L between the center of the of the susceptor 200 and the opening edge 210C of the counterbore portion 210 is fixed at $L_0$, and accordingly the pocket width $P_{W0}$ is also fixed. However, as described below in a third embodiment, the height difference H and the shoulder height $H_{W0}$ in the susceptor 200 of the second embodiment need not be fixed and may vary.

(Susceptor of Third Embodiment)

As described above, the height different H may vary in the susceptor 100 of the first embodiment, and the radial distance L may vary in the susceptor 200 of the second embodiment. In this case, the variation of the radial distance L according to the first embodiment and the variation of the height difference H according to the second embodiment preferably occur in association with each other. Specifically, the susceptor according to the third embodiment is provided with a concave counterbore portion on which a silicon wafer is placed, and the radial distance between the center of the susceptor and an opening edge of the counterbore portion varies at 90° periods in the circumferential direction. Meanwhile, when the angle at which the radial distance L is minimum is 0°, the radial distance L is minimum at 90°, 180°, and 270°; and the radial distance L is maximum at 45°, 135°, 225°, and 315°. Accordingly, the pocket width Lp also varies in conformance with the variation of the radial distance L. Further, the opening edge describes four first elliptical arcs being convex radially outward when the susceptor is viewed from above. In this susceptor, the difference H between the heights of an upper end and a lower end of an inner wall surface on the opening edge side of the counterbore portion varies at 90° periods in the circumferential direction. Meanwhile, when the angle at which the height difference H is maximum is 0°, the height difference H is maximum at 90°, 180°, and 270°, and the height difference H is minimum at 45°, 135°, 225°, and 315°. Further, in a projection view of the radial exterior of the susceptor, the opening edge of the counterbore portion describes four second elliptical arcs being convex on the bottom side of the counterbore portion.

The conditions required of the first elliptical arcs are as described above in the first embodiment, and the conditions required of the second elliptical arcs are as described above in the second embodiment. The first and second elliptical arcs may be provided so that the growth rate orientation dependence can be reduced by adjusting the oblateness of the ellipse forming each first elliptical arc and the oblateness of the ellipse forming each second elliptical arc as appropriate. In particular, it is preferred that the silicon wafer is placed so that a <110> direction of the silicon wafer conforms to the direction of 0° of the susceptor, and in the epitaxial silicon wafer in which an epitaxial layer is formed on a surface of the silicon wafer, and the first elliptical arcs and the second elliptical arcs are provided such that the circumferential thickness profile variation index $\Delta t_0$ of the epitaxial layer at the position of 1 mm from the edge of the epitaxial silicon wafer in the circumferential direction is 0.75% or less. Here, the circumferential variation index $\Delta t_0$ is defined by Equation 1 above. More preferably, the first elliptical arcs and the second elliptical arcs are provided such that the circumferential variation index $\Delta t_0$ is 0.70% or less, yet more preferably, the first elliptical arcs and the second elliptical arcs are provided such that the circumferential variation index $\Delta t_0$ is 0.65% or less. Although the lower limit is not limited, the circumferential variation index $\Delta t_0$ can be set to 0.10% or more in accordance with this embodiment.

Placing the silicon wafer so that a <110> direction of the silicon wafer conforms to the direction of 0° of the susceptor 100 and forming an epitaxial layer on a surface of the silicon wafer can increase the circumferential flatness uniformity of the epitaxial layer of the epitaxial silicon wafer.

Specific preferred aspects of the first embodiment to the third embodiment will now be described.

As a material of the susceptor, a carbon substrate having a surface coated with silicon carbide (SiC) is typically used in order to reduce contamination from the susceptor when an epitaxial layer is formed. Alternatively, the whole susceptor may be formed from SiC, or the susceptor may be formed to contain other materials inside as long as the susceptor surface is coated with SiC. In another preferred aspect, the susceptor surface is coated with a silicon film. This can prevent contamination from the susceptor into the epitaxial film.

In FIGS. 4C, 4D, 5C, and 5D, ledge portions 110L and 210L where the susceptor and the silicon wafer W are in contact with one another are depicted as tapered inclined surfaces. This aspect is one of preferred aspects since the contact between the silicon wafer W and the susceptor is a point contact, resulting in a small contact area. On the other hand, a portion where the susceptor and the silicon wafer W are in contact with one another (ledge portion) is not necessarily an inclined surface but may be a horizontal surface. In this case, the contact between the horizontal surface and the silicon wafer W is a surface contact, thus the silicon wafer W can be supported.

Further, in the susceptor according to the above embodiments, bottom surfaces 110B and 210B of the counterbore portions are typically provided with lift pin holes (not shown) for raising and lowering the silicon wafer W by sliding lift pins through the holes when the silicon wafer is placed. Further, one or more through holes extending from each bottom surface 110B, 210B to the back surface of the susceptor may be provided at one or more points. Such a through hole is useful in discharging a gas between the susceptor and the silicon wafer to the back side of the susceptor when the silicon wafer W is loaded on the counterbore portion of the susceptor.

Figure 6:
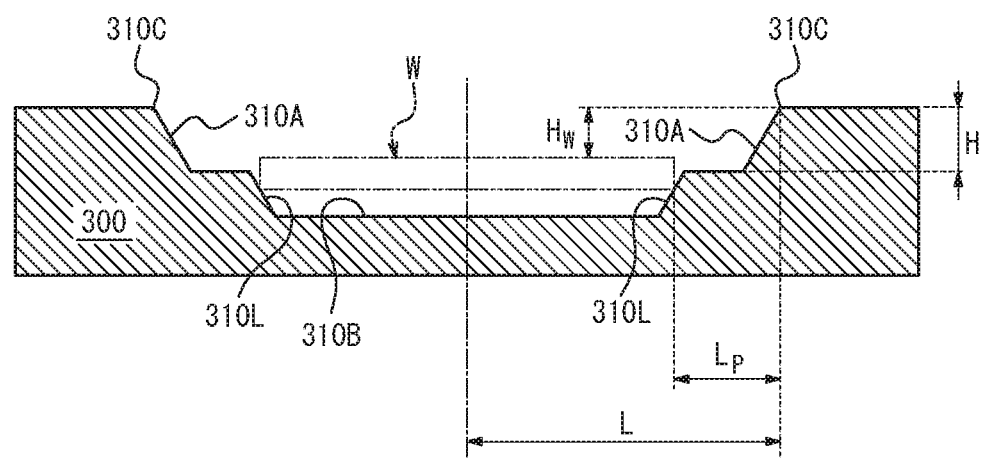
FIG. 6 is a schematic cross-sectional view of a susceptor according to another embodiment of this disclosure.

Further, in the susceptor of each embodiment described above, the shape of the inner wall surface of the counterbore portion may be of various shapes. In FIGS. 4C, 4D, 5C, and 5D, the inner wall surfaces 110A, 210A are depicted as being perpendicular to the silicon wafer W; alternatively, an inner wall surface 310A on the opening edge 310C side may have an inclined surface as illustrated in FIG. 6.

(Epitaxial Growth Apparatus)

Figure 7:
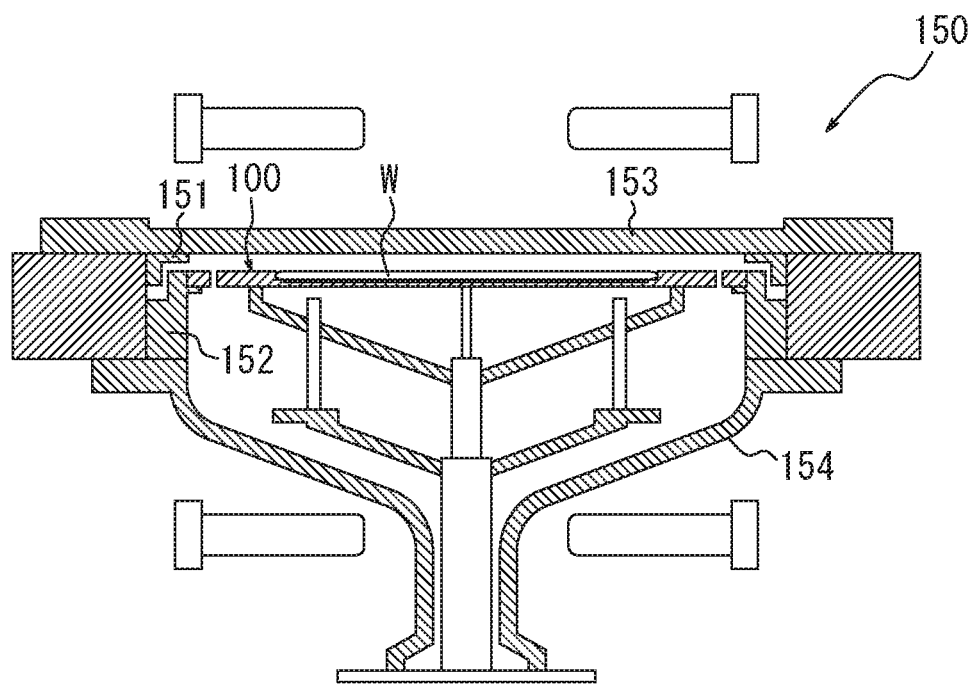
FIG. 7 depicts an epitaxial growth apparatus including a susceptor according to one embodiment of this disclosure.

Further, an epitaxial growth apparatus of this disclosure includes a susceptor according to one of the first embodiment to the third embodiment described above. For example, as illustrated in FIG. 7, an epitaxial growth apparatus 150 may include an upper liner 151 and a lower liner 152 for maintaining the airtightness, and an upper dome 153 and a lower dome 154 may define an epitaxial growth reactor. Further, the susceptor 100 for horizontally placing a silicon wafer W is provided inside the epitaxial growth reactor. When an epitaxial wafer having a large diameter is produced, a single-wafer processing vapor deposition apparatus as depicted in FIG. 7 is typically used. Note that although FIG. 7 depicts the susceptor 100 according to the first embodiment; alternatively, a susceptor according to the second embodiment or the third embodiment can naturally be used in an epitaxial growth apparatus.

(Method of Producing Epitaxial Silicon Wafer)

Further, a method of producing an epitaxial silicon wafer includes placing a silicon wafer on the susceptor according to one of the first embodiment to the third embodiment described above so that a <110> direction of the silicon wafer conforms to the direction of 0° of the susceptor, and forming an epitaxial layer on a surface of the silicon wafer. The placing step may be performed by a conventional method, for example, using lift pins or blowing a silicon source gas onto the silicon wafer surface under vapor deposition conditions typically used to form an epitaxial layer.

(Epitaxial Silicon Wafer)

Further, an epitaxial silicon wafer in which an epitaxial layer is formed on a surface of the silicon wafer, and the circumferential thickness profile variation index $\Delta t_0$ of the epitaxial layer at the position of 1 mm from the edge of the epitaxial silicon wafer in the circumferential direction is 0.75% or less can be obtained in accordance with the above production method. Here, the circumferential variation index $\Delta t_0$ is defined by Equation 1 above. Such an epitaxial silicon wafer excellent in the circumferential uniformity can only be obtained using a susceptor according to one of the first to third embodiments. More preferably, the circumferential variation index $\Delta t_0$ is 0.70% or less, yet more preferably, the circumferential variation index $\Delta t_0$ is 0.65% or less. Although the lower limit is not limited, the circumferential variation index $\Delta t_0$ can be set to 0.10% or more in accordance with this embodiment.

EXAMPLES

Experimental Example 1

First, susceptors according to Conventional Example 1, Comparative Example 1, and Example 1 described below were produced. A silicon epitaxial layer was formed by epitaxial growth on a surface of a boron-doped silicon wafer with a diameter of 300 mm of which (100) plane is grown using each of the three susceptors, thereby obtaining epitaxial silicon wafers.

In producing the silicon epitaxial wafers, each silicon wafer was transferred to an epitaxial film formation chamber and was then placed on the susceptor using lift pins. Subsequently, hydrogen gas was supplied at 1130° C. to perform a hydrogen bake. A silicon epitaxial layer was then grown to 4 μm at 1130° C., thereby obtaining the epitaxial silicon wafer. In this process, trichlorosilane gas was used as a raw material source gas, diborane gas as a dopant gas, and hydrogen gas as a carrier gas.

Conventional Example 1

A susceptor was prepared to have a fixed radial distance L from the susceptor center to the opening edge of a counterbore portion and a fixed counterbore depth (the pocket width $L_p$, the height difference H, and the shoulder height $H_W$ were also fixed). Here, the shoulder height Hw was set to 0.80 mm. When the susceptor according to Conventional Example 1 is viewed from above, the opening edge describes a single circular arc.

Comparative Example 1

Figure 8A:
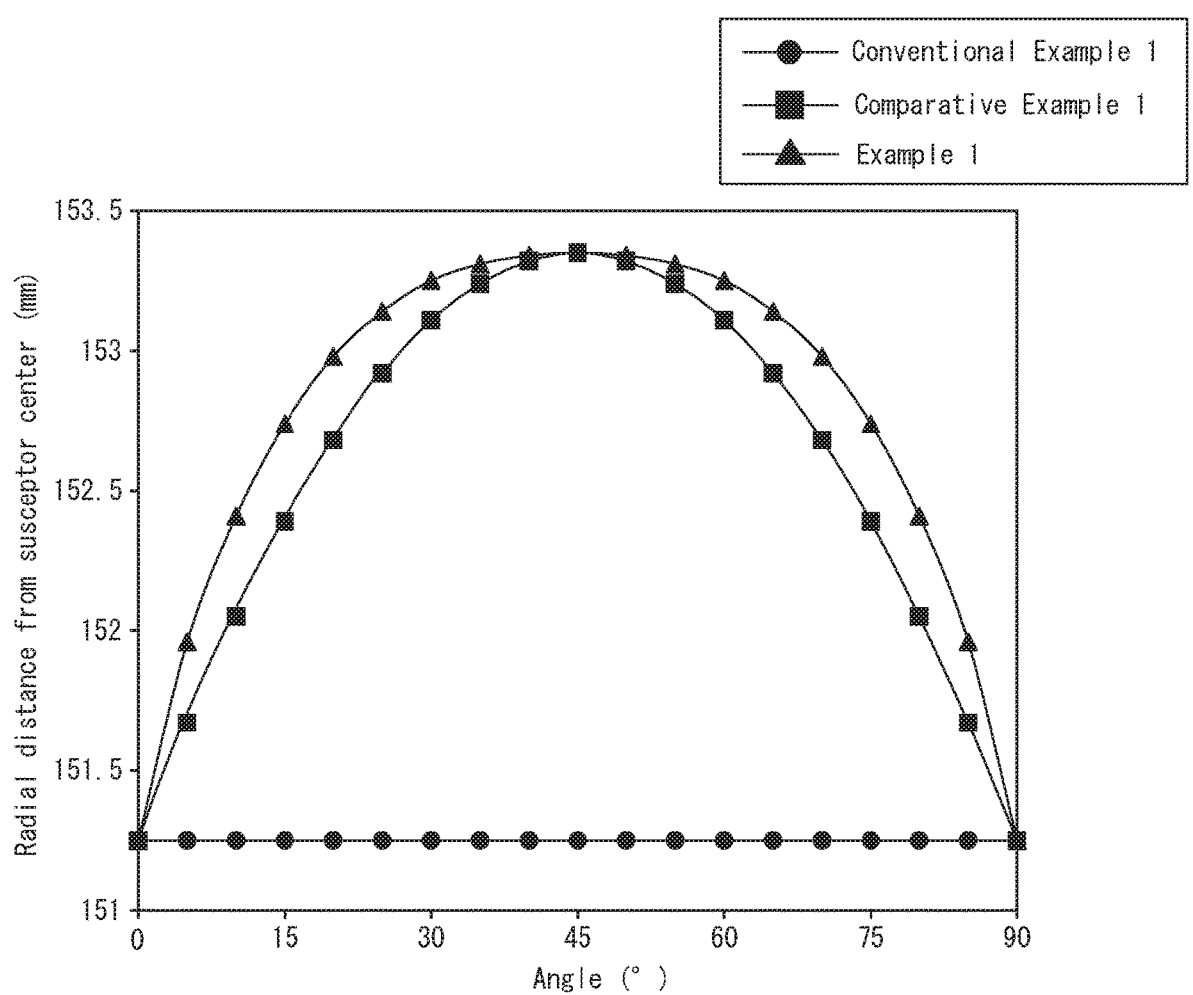
FIG. 8A is a graph illustrating the relationship between the angle in the circumferential direction of susceptors according to Example 1, Comparative Example 1, and Conventional Example 1 and the radial distance from each susceptor center to the opening edge of a counterbore portion.

A susceptor was prepared to have a radial distance L from the center to the opening edge of a counterbore portion, varied at 90° periods with the amount of variations given in Table 1 and FIG. 8A. When the susceptor according to Comparative Example 1 is viewed from above, the opening edge describes four circular arcs. The counterbore depth was fixed (the height difference H and the shoulder height $H_W$ were also fixed), and the shoulder height $H_W$ was set to 0.80 mm as in Conventional Example 1.

Example 1

A susceptor was prepared to have a radial distance L from the center to the opening edge of a counterbore portion, varied at 90° periods with the amount of variations given in Table 1 and FIG. 8A. When the susceptor according to Example 1 is viewed from above, the opening edge describes four elliptical arcs. The counterbore depth was fixed (the height difference H and the shoulder height $H_W$ were also fixed), and the shoulder height $H_W$ was set to 0.80 mm as in Conventional Example 1.

TABLE 1

| | Radial distance from susceptor center | | |
|---|---|---|---|
| Angle (°) | Conventional Example 1 | Comparative Example 1 | Example 1 |
| 0 | 151.25 | 151.25 | 151.25 |
| 5 | 151.25 | 151.67 | 151.96 |
| 10 | 151.25 | 152.05 | 152.41 |
| 15 | 151.25 | 152.39 | 152.74 |
| 20 | 151.25 | 152.68 | 152.98 |
| 25 | 151.25 | 152.92 | 153.14 |
| 30 | 151.25 | 153.11 | 153.25 |
| 35 | 151.25 | 153.24 | 153.31 |
| 40 | 151.25 | 153.32 | 153.34 |
| 45 | 151.25 | 153.35 | 151.35 |
| 50 | 151.25 | 153.32 | 153.34 |
| 55 | 151.25 | 153.24 | 153.31 |
| 60 | 151.25 | 153.11 | 151.25 |
| 65 | 151.25 | 152.92 | 153.14 |
| 70 | 151.25 | 152.68 | 152.98 |
| 75 | 151.25 | 157.39 | 157.74 |
| 80 | 151.25 | 152.05 | 152.41 |
| 85 | 151.25 | 151.67 | 151.96 |
| 90 | 151.25 | 151.25 | 151.25 |

<Evaluation>

The epitaxial silicon wafers produced using the susceptors of Conventional Example 1, Comparative Example 1, and Example 1 were each subjected to measurements of the circumferential thickness profile at the position of 1 mm from the wafer edge using a thickness measurement system (QS3300 manufactured by Nanometrics Incorporated). The results are given in the graph of FIG. 8B. As is evident from this graph, excellent uniformity of the circumferential thickness profile was achieved using the susceptor according to Example 1.

Figure 8B:
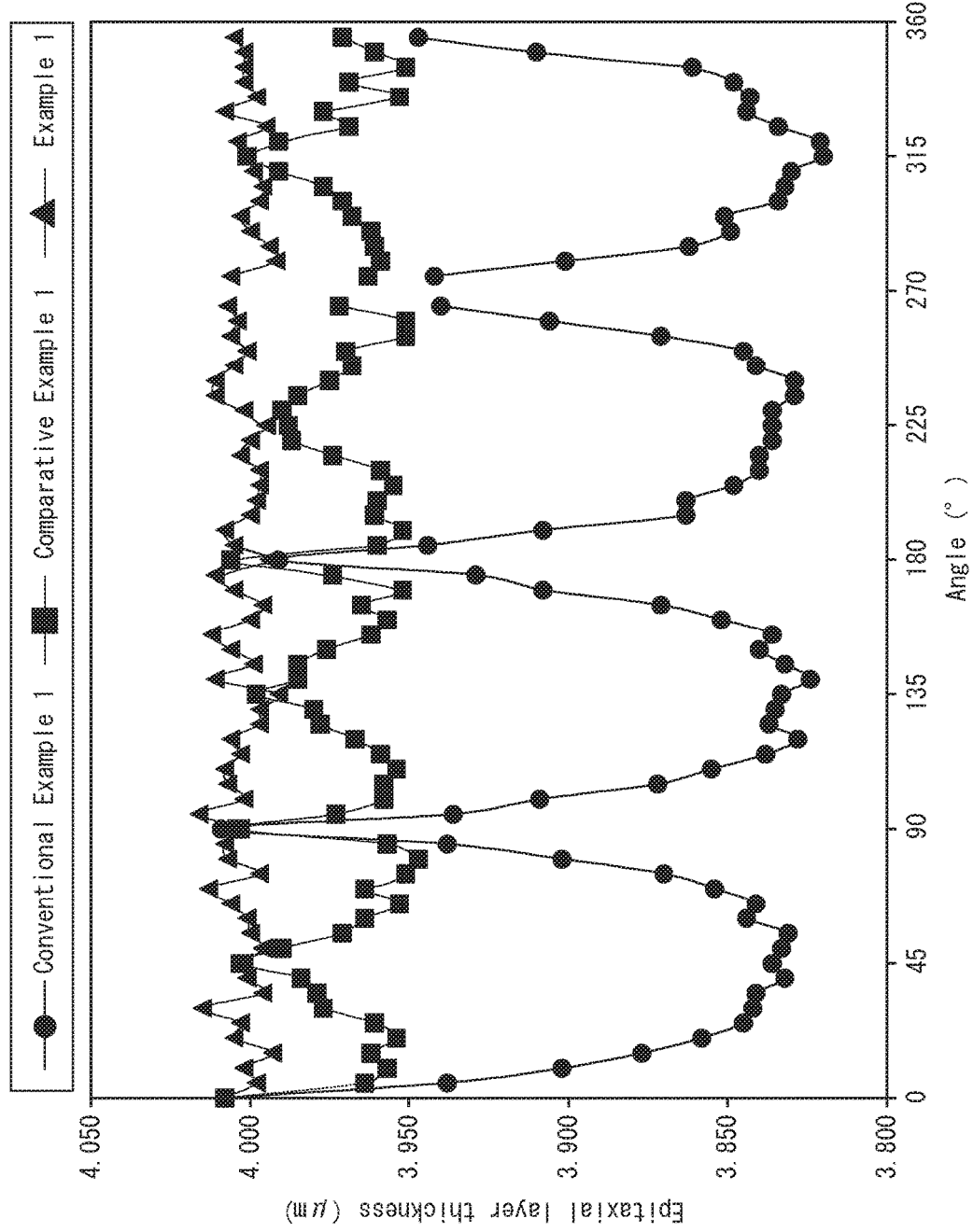
FIG. 8B is a graph depicting the circumferential thickness profile of the epitaxial layer at the position of 1 mm from the edge of an epitaxial silicon wafer obtained using the susceptor according to each of Example 1, Comparative Example 1, and Conventional Example 1.
Figure 8C:
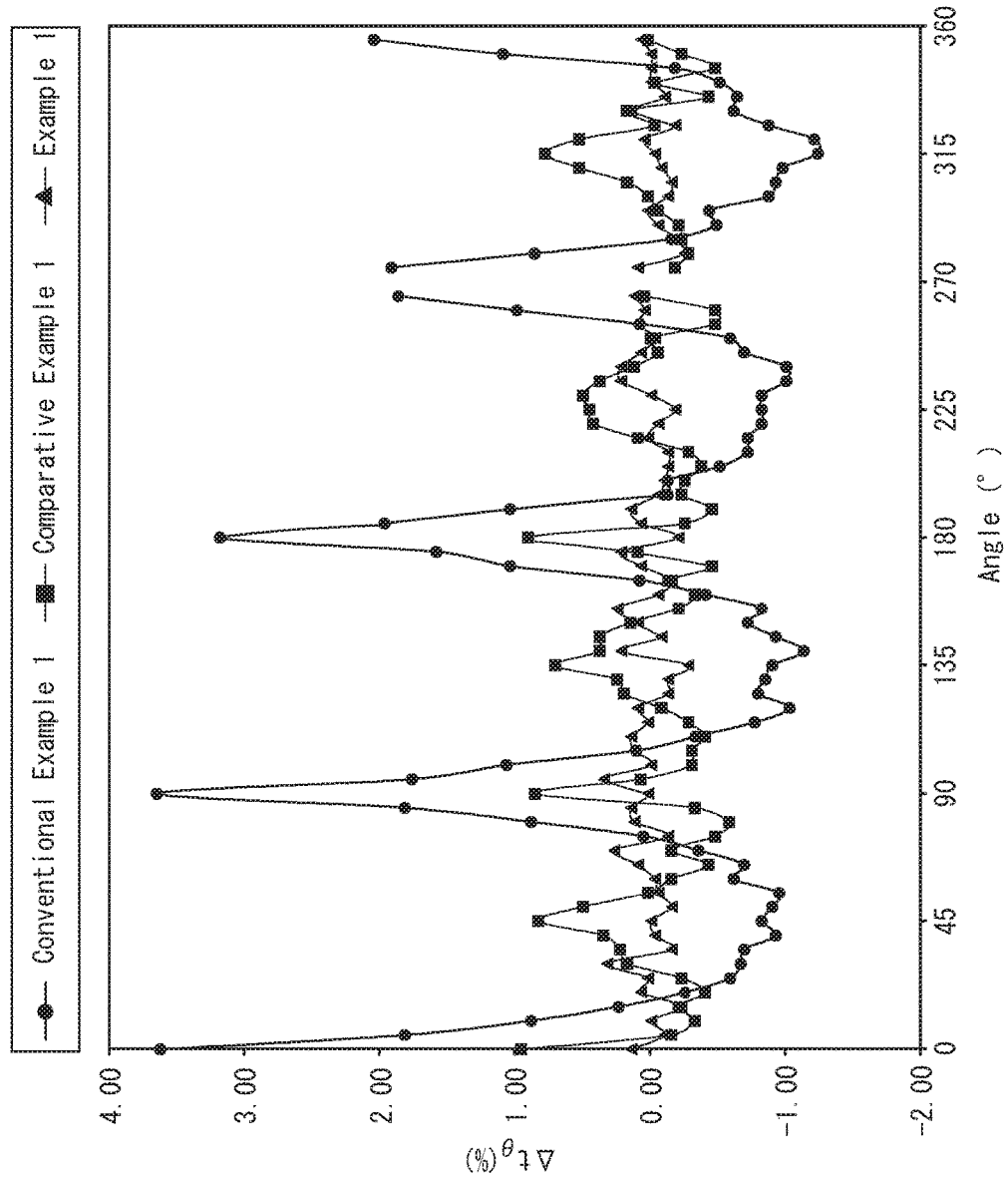
FIG. 8C is a graph depicting a relative value $\Delta t_\theta$ with respect to the average thickness $t_{Ave}$ in the circumferential thickness profile of the epitaxial layer at the position of 1 mm from the edge of the epitaxial silicon wafer obtained using the susceptor according to each of Example 1, Comparative Example 1, and Conventional Example 1.

Further, FIG. 8C presents a graph relative to the graph of FIG. 8B with respect to the average thickness of the epitaxial layer, i.e., a graph representing the relative value $\Delta t_\theta$ of the thickness at the angle θ with respect to the average thickness $t_{Ave}$ of the circumferential thickness profile of each epitaxial layer. Here, $\Delta t_\theta$ is given by Equation 2 below. The vertical axis is represented by percentage.

$$\Delta t_\theta = \frac{t_\theta - t_{Ave}}{t_{Ave}}, \quad [2]$$

where $t_\theta$ is the thickness of the epitaxially layer at the position of 1 mm from the edge at an angle θ in the circumferential direction, and $t_{Ave}$ is the average thickness of the epitaxial layer at the position of 1 mm from the edge in the circumferential direction.

As is also evident from FIG. 8C, excellent uniformity of the circumferential thickness profile was achieved using the susceptor according to Example 1.

Note that in Comparative Example 1, variation at 45° periods was found in the thickness profile. Since the opening edge had a circular arc shape, the variation of the pocket width would be insufficient, and accordingly the growth rate of the epitaxial layer would be insufficient. On the other hand, in Example 1, since the variations of the pocket width were abrupt as compared with Comparative Example 1, it is likely that the epitaxial layer was successfully grown in accordance with the growth rate orientation dependence of the silicon wafer.

Experimental Example 2

Susceptors according to Comparative Example 2 and Example 2 described below were fabricated in addition to the susceptor according to Conventional Example 1 used in Experimental Example 1. A silicon epitaxial layer was formed by epitaxial growth on a surface of a boron-doped silicon wafer with a diameter of 300 mm using each of the three susceptors, thereby obtaining epitaxial silicon wafers, as in Experimental Example 1.

Comparative Example 2

Figure 9A:
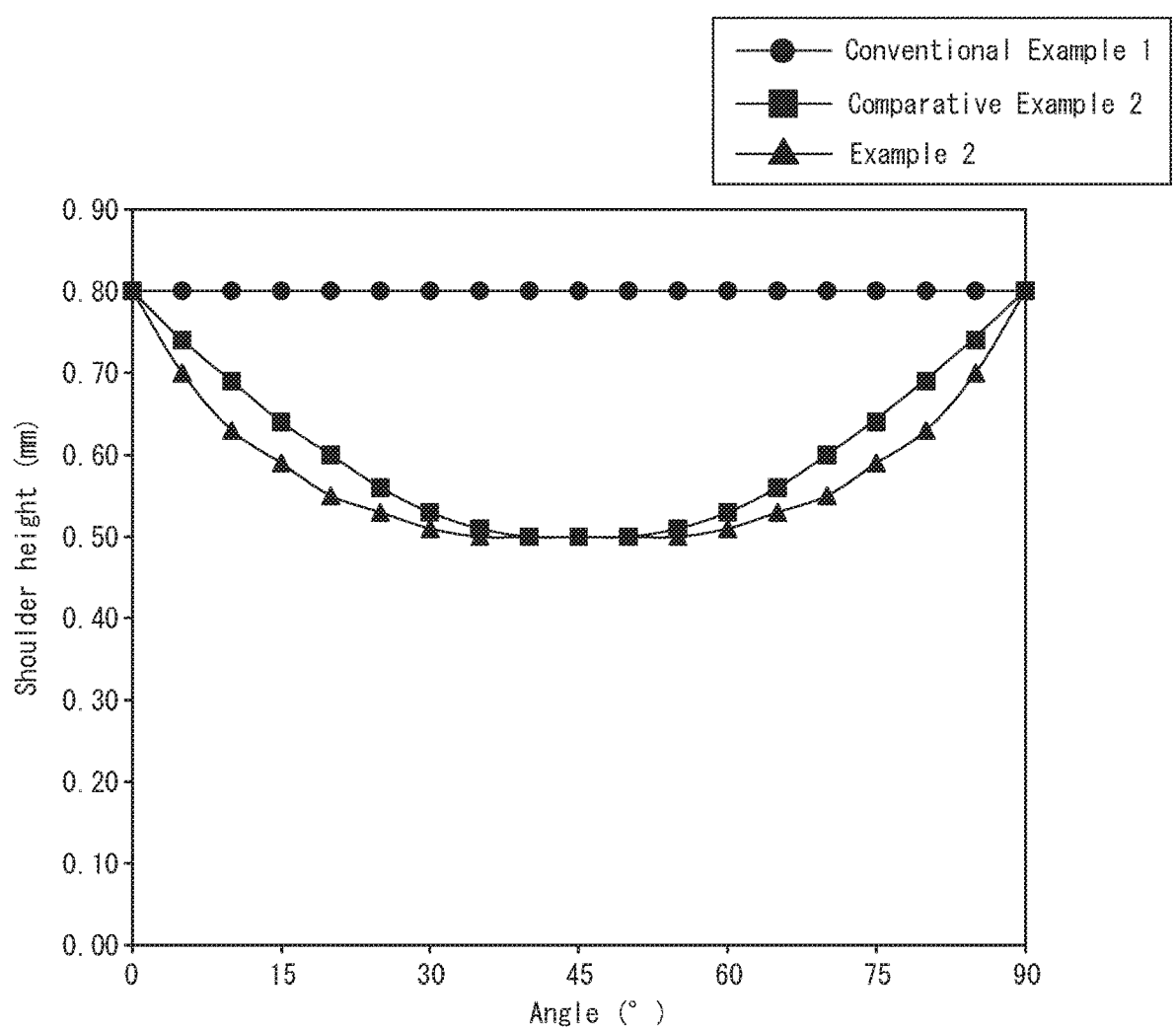
FIG. 9A is a graph illustrating the relationship between the angle in the circumferential direction of the susceptors according to Example 2, Comparative Example 2, and Conventional Example 1 and the shoulder height of the susceptor.

A susceptor was prepared in which the shoulder height $H_W$ in the circumferential direction was varied at 90° periods with the amount of variations given in Table 2 and FIG. 9A. In a projection view of the radial exterior of the susceptor according to Comparative Example 2, the opening edge of the counterbore portion described four circular arcs being convex on the bottom side of the counterbore portion. Note that the radial distance L from the susceptor center to the opening edge of the counterbore was fixed at 151.25 mm (pocket width: 1.25 mm).

Example 2

A susceptor was prepared in which the shoulder height $H_W$ in the circumferential direction was varied at 90° periods with the amount of variations given in Table 2 and FIG. 9A. In a projection view of the radial exterior of the susceptor according to Example 2, the opening edge of the counterbore portion described four elliptical arcs being convex on the bottom side of the counterbore portion. Note that the radial distance L from the susceptor center to the opening edge of the counterbore was fixed at 151.25 mm (pocket width: 1.25 mm).

TABLE 2

| | Shoulder height (mm) | | |
|---|---|---|---|
| Angle (°) | Conventional Example 1 | Comparative Example 2 | Example 2 |
| 0 | 0.80 | 0.80 | 0.80 |
| 5 | 0.80 | 0.74 | 0.70 |
| 10 | 0.80 | 0.69 | 0.63 |
| 15 | 0.80 | 0.64 | 0.59 |
| 20 | 0.80 | 0.60 | 0.55 |
| 25 | 0.80 | 0.56 | 0.53 |
| 30 | 0.80 | 0.53 | 0.51 |
| 35 | 0.80 | 0.51 | 0.50 |
| 40 | 0.80 | 0.50 | 0.50 |
| 45 | 0.80 | 0.50 | 0.50 |
| 50 | 0.80 | 0.50 | 0.50 |
| 55 | 0.80 | 0.51 | 0.50 |
| 60 | 0.80 | 0.53 | 0.51 |
| 65 | 0.80 | 0.56 | 0.53 |
| 70 | 0.80 | 0.60 | 0.55 |
| 75 | 0.80 | 0.64 | 0.59 |
| 80 | 0.80 | 0.69 | 0.63 |
| 85 | 0.80 | 0.74 | 0.70 |
| 90 | 0.80 | 0.80 | 0.80 |

<Evaluation>

The epitaxial silicon wafers produced using the susceptors of Conventional Example 1, Comparative Example 2, and Example 2 were each subjected to measurements of the circumferential thickness profile at the position of 1 mm from the wafer edge using a thickness measurement system (QS3300 manufactured by Nanometrics Incorporated). The results are given in the graph of FIG. 9B. As is evident from this graph, excellent uniformity of the circumferential thickness profile was achieved using the susceptor according to Example 2.

Figure 9B:
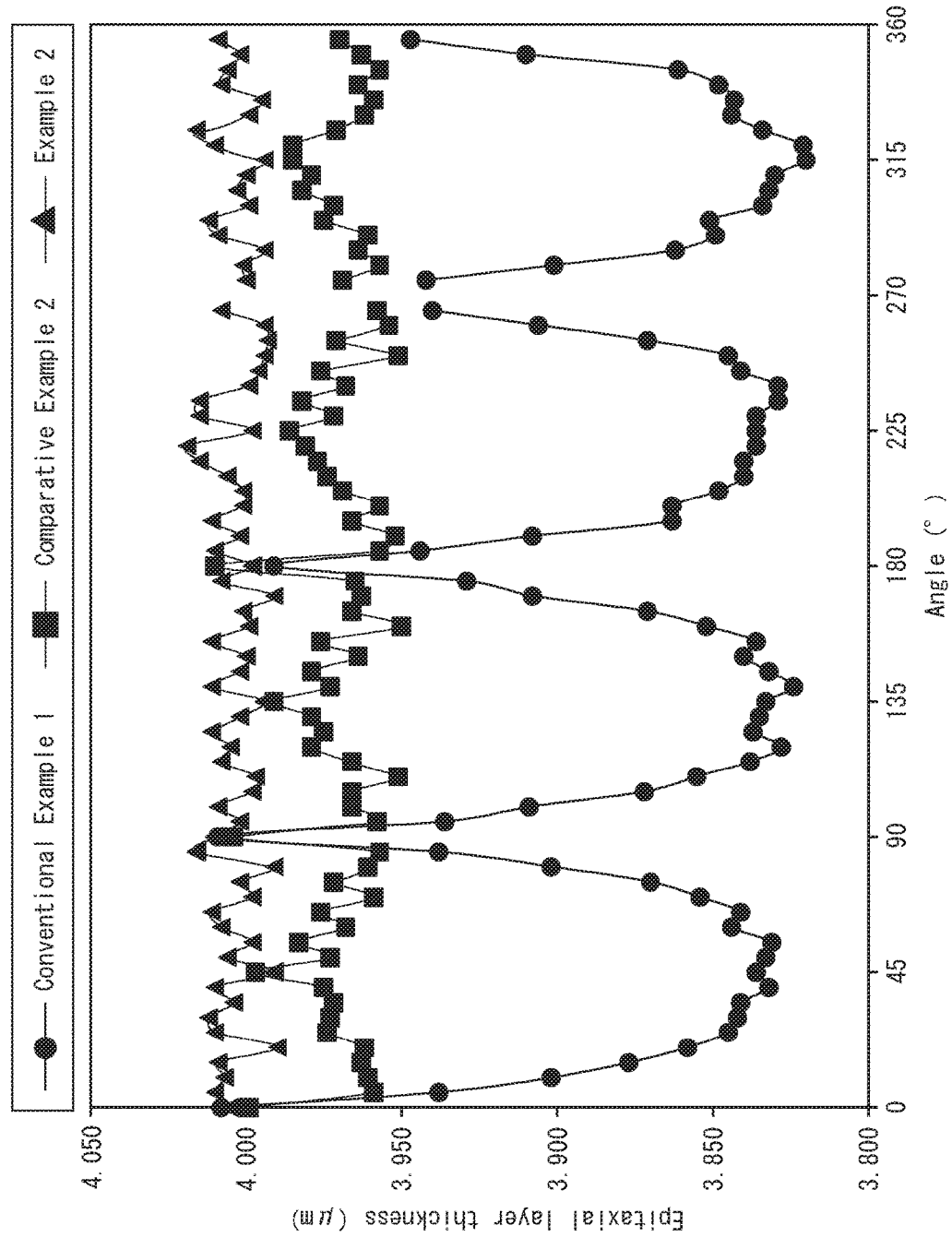
FIG. 9B is a graph depicting the circumferential thickness profile of an epitaxial layer at the position of 1 mm from the edge of the epitaxial silicon wafer obtained using the susceptor according to each of Example 2, Comparative Example 2, and Conventional Example 1.
Figure 9C:
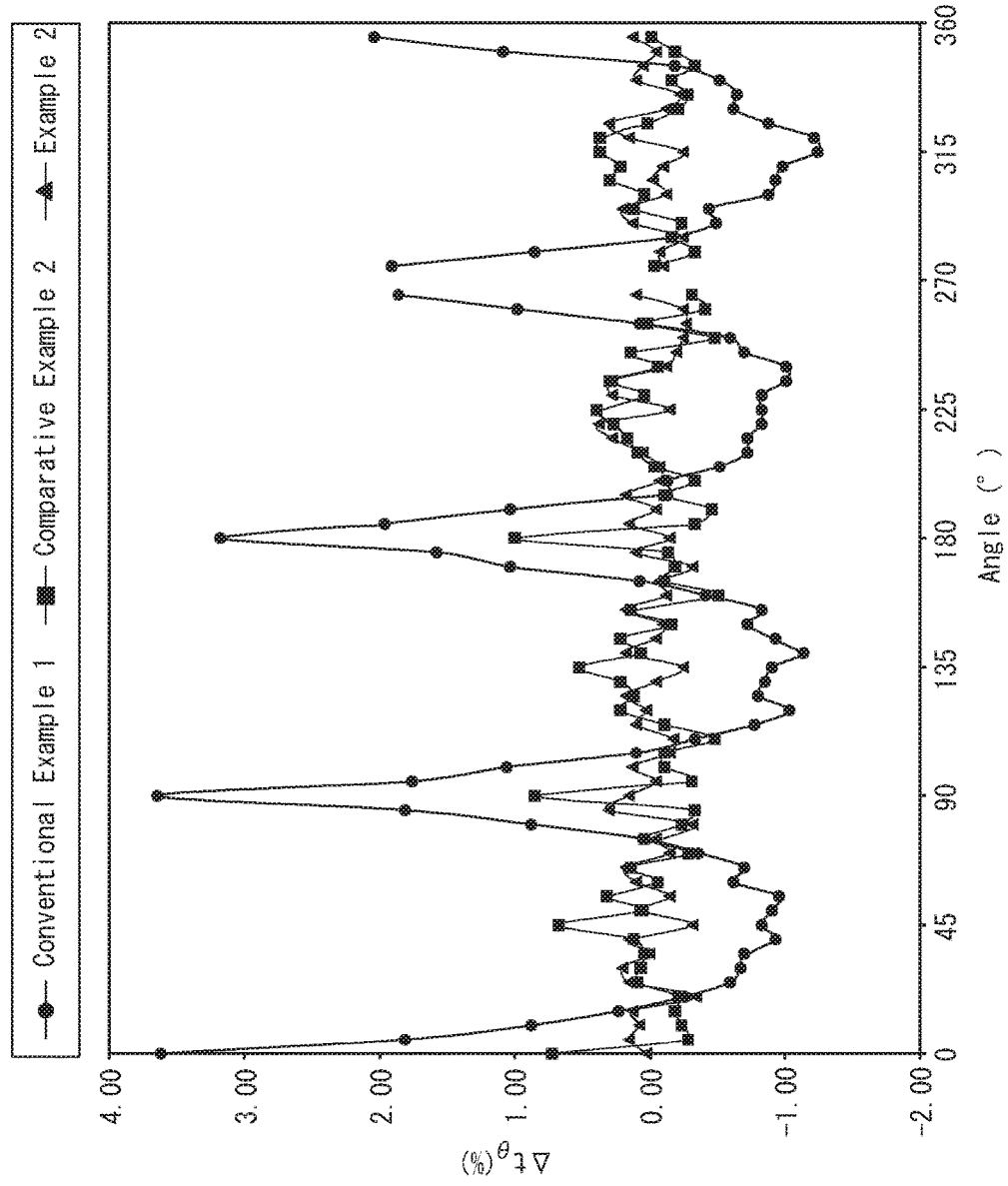
FIG. 9C is a graph depicting a relative value $\Delta t_\theta$ with respect to the average thickness $t_{Ave}$ in the circumferential thickness profile of the epitaxial layer at the position of 1 mm from the edge of an epitaxial silicon wafer obtained using the susceptor according to each of Example 2, Comparative Example 2, and Conventional Example 1.

Further, FIG. 9C presents a graph relative to the graph of FIG. 9B with respect to the average thickness of the epitaxial layer, i.e., a graph representing the relative value $\Delta t_\theta$ of the thickness at the angle θ with respect to the average thickness $t_{Ave}$ of the circumferential thickness profile of each epitaxial layer as with the relationship between FIG. FIGS. 8B and 8C. Here, $\Delta t_\theta$ is given by Equation 2 above. The vertical axis is represented by percentage as in FIG. 8C.

As is also evident from FIG. 9C, excellent uniformity of the circumferential thickness profile was achieved using the susceptor according to Example 2.

Note that in Comparative Example 2, variation at 45° periods was found in the thickness profile as in Comparative Example 1. Since the opening edge had a circular arc shape, the variation of the shoulder height would be insufficient, and accordingly the growth rate of the epitaxial layer would be insufficient. On the other hand, in Example 2, since the variations of the shoulder height were abrupt as compared with Comparative Example 2, it is likely that the epitaxial layer was successfully grown in accordance with the growth rate orientation dependence of the silicon wafer.

Figure 10A:
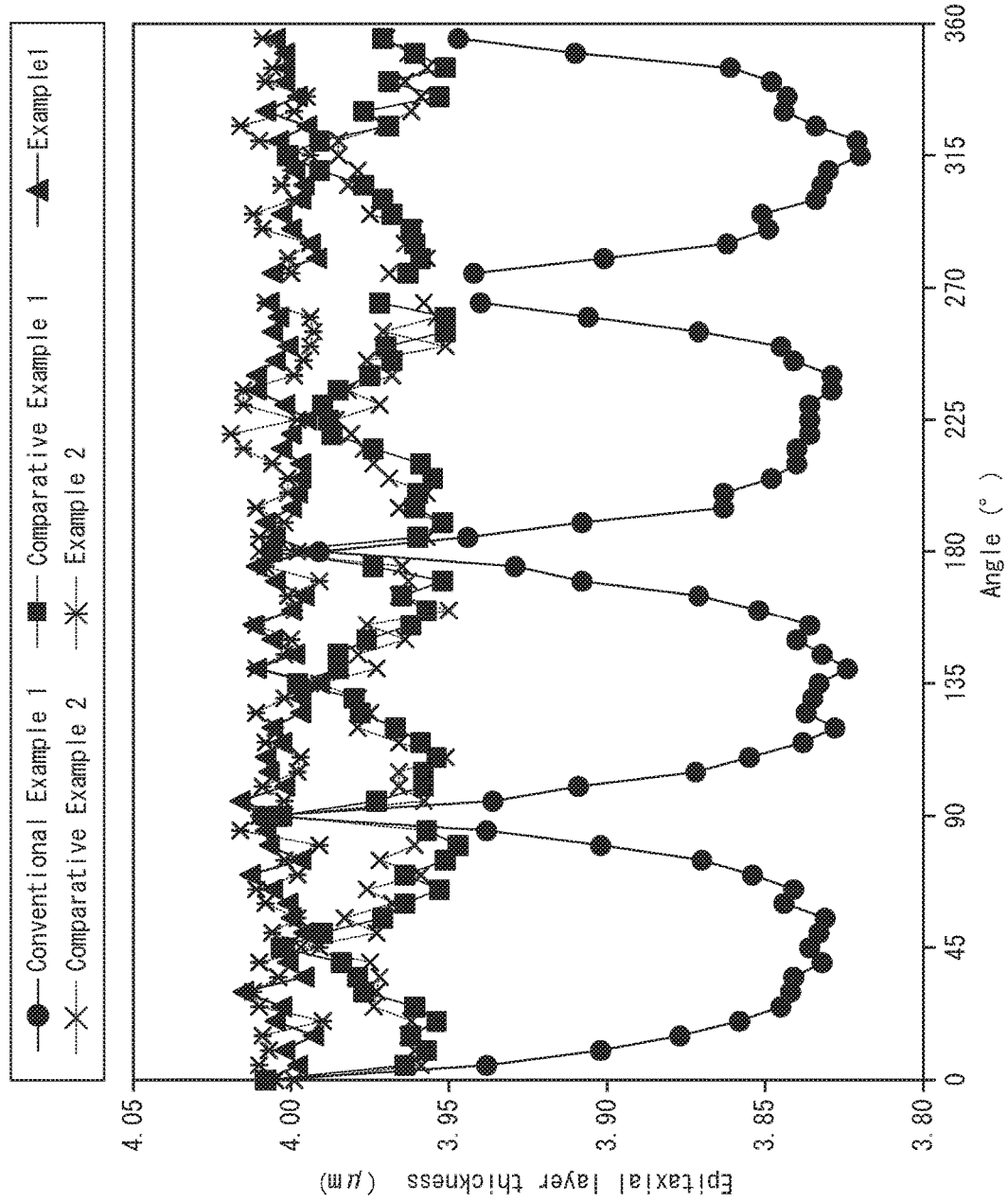
FIG. 10A is a graph depicting the circumferential thickness profile of the epitaxial layer at the position of 1 mm from the edge of the epitaxial silicon wafer obtained using the susceptor according to each of Examples 1 and 2, Comparative Examples 1 and 2, and Conventional Example 1.
Figure 10B:
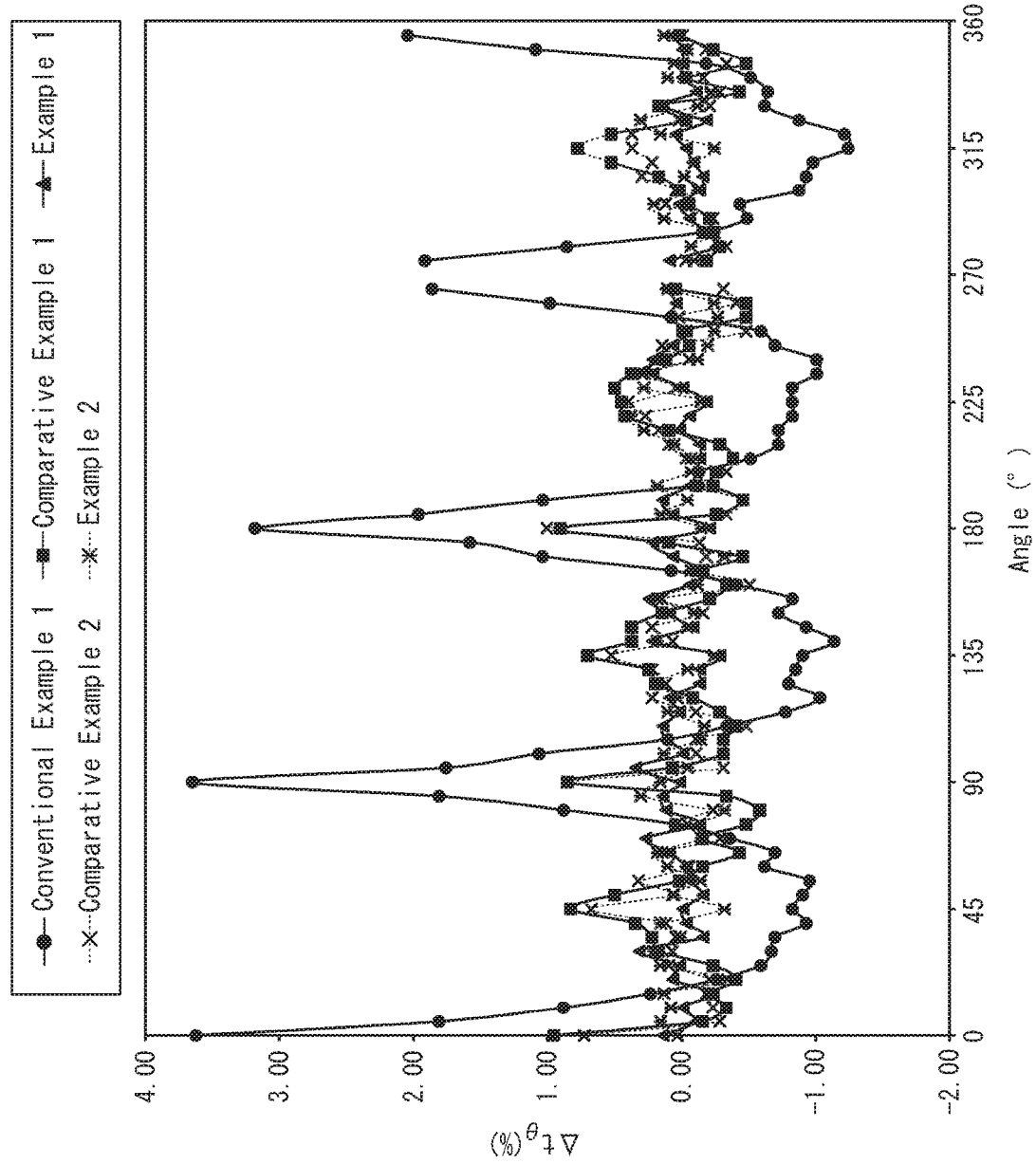
FIG. 10B is a graph depicting a relative value $\Delta t_\theta$ with respect to the average thickness $t_{Ave}$ in the circumferential thickness profile of the epitaxial layer at the position of 1 mm from the edge of the epitaxial silicon wafer obtained using the susceptor according to each of Examples 1 and 2, Comparative Examples 1 and 2, and Conventional Example 1.

The circumferential thickness profile at the position of 1 mm from the wafer edge of each epitaxial silicon wafer produced using the susceptor of Conventional Example 1, Comparative Examples 1, 2, and Examples 1, 2 is depicted in the graph of FIG. 10A. Further, FIG. 10B presents a graph relative to the graph of FIG. 10A with respect to the average thickness of the epitaxial layer. Good results were obtained when the pocket width was varied as in Example 1 and also when the shoulder height was varied as in Example 2.

Further, the circumferential thickness profile variation index $\Delta t_\theta$ (according to Equation 1 above) in each of Examples 1, 2, Comparative Examples 1, 2, and Conventional Example 1 is given in Table 3 below. In Examples 1 and 2, the epitaxial silicon wafers obtained were found to have a significantly low circumferential thickness profile variation index of a previously impossible level.

TABLE 31

| | Circumferential variation index $\Delta t_\theta$ |
|---|---|
| Example 1 | 0.62% |
| Example 2 | 0.72% |
| Comparative Example 1 | 1.53% |
| Comparative Example 2 | 1.51% |
| Conventional Example 1 | 4.89% |

INDUSTRIAL APPLICABILITY

This disclosure provides a susceptor which makes it possible to increase the circumferential flatness uniformity of an epitaxial layer of an epitaxial silicon wafer. This disclosure also provides an epitaxial growth apparatus including the susceptor. Further, this disclosure provides a method of producing an epitaxial silicon wafer using the susceptor and an epitaxial silicon wafer having improved circumferential flatness uniformity, which can be obtained by the method.

REFERENCE SIGNS LIST 100, 200, 300: Susceptor
110, 210, 310: Counterbore portion
110A, 210A, 310A: Inner wall surface
110B, 210B, 310B: Bottom surface
110C, 210C, 310C: Opening edge
110L, 210L, 310L: Ledge portion
W: Silicon wafer
L: Radial distance between susceptor center and opening edge of counterbore portion
$L_p$: Pocket width
H: Difference between heights of upper and lower ends of the inner wall surface
$H_w$: Shoulder height

The invention claimed is:

1. An epitaxial growth apparatus including a susceptor for placing a silicon wafer thereon,
the susceptor being provided with a concave counterbore portion in which the silicon wafer is placed,
wherein a radial distance between a center of the susceptor and an opening edge of the counterbore portion varies at 90° periods in the circumferential direction, and when an angle at which the radial distance is minimum is 0°, the radial distance is minimum at 90°, 180°, and 270°, and the radial distance is maximum at 45°, 135°, 225°, and 315°,
the opening edge describes four elliptical arcs being convex radially outward when the susceptor is viewed from above;
wherein the silicon wafer is placed so that a <110> direction of the silicon wafer conforms to the direction of 0° of the susceptor, and in an epitaxial silicon wafer in which an epitaxial layer is formed on a surface of the silicon wafer, the elliptical arcs are provided such that a circumferential thickness profile variation index $\Delta t_o$ of the epitaxial layer at a position of 1 mm from an edge of the epitaxial silicon wafer in a circumferential direction according to Equation 1 below is 0.75% or less, $$\Delta t_0 = \frac{t_{Max} - t_{min}}{t_{Ave}}, \quad [1]$$

where $t_{Max}$ is a maximum thickness of the epitaxial layer at the position of 1 mm from the edge in the circumferential direction, $t_{Min}$ is a minimum thickness of the epitaxial layer at the position of 1 mm from the edge in the circumferential direction, and $t_{Ave}$ is an average thickness of the epitaxial layer at the position of 1 mm from the edge in the circumferential direction; and wherein a counterbore depth between heights of an upper end of the opening edge and a lower end of an inner wall surface on an opening edge side of the counterbore portion of the susceptor and a shoulder height between heights of the upper end of the opening edge and a top surface of the silicon wafer are fixed.

* * * * *